United States Patent
Aoki

(10) Patent No.: US 9,143,130 B2
(45) Date of Patent: Sep. 22, 2015

(54) INTEGRATED CIRCUIT AND CONTROL METHOD THEREOF

(71) Applicant: CANON KABUSHIKI KAISHA, Tokyo (JP)

(72) Inventor: Koji Aoki, Kamakura (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 0 days.

(21) Appl. No.: 14/194,878

(22) Filed: Mar. 3, 2014

(65) Prior Publication Data
US 2014/0266335 A1   Sep. 18, 2014

(30) Foreign Application Priority Data
Mar. 14, 2013   (JP) ................. 2013-051130

(51) Int. Cl.
*H03K 19/00* (2006.01)
*H03K 17/22* (2006.01)

(52) U.S. Cl.
CPC ............ *H03K 19/0016* (2013.01); *H03K 17/22* (2013.01)

(58) Field of Classification Search
USPC .................................... 327/142, 143, 198
See application file for complete search history.

(56) References Cited

U.S. PATENT DOCUMENTS

| | | | |
|---|---|---|---|
| 6,429,704 B1 | 8/2002 | Kanai et al. | 327/113 |
| 2002/0149353 A1 | 10/2002 | Inaba | 323/283 |

FOREIGN PATENT DOCUMENTS

| | | |
|---|---|---|
| JP | 10-320072 | 12/1998 |
| JP | 2001-101764 | 4/2001 |
| JP | 2002-312073 | 10/2002 |

*Primary Examiner* — Brandon S Cole
(74) *Attorney, Agent, or Firm* — Fitzpatrick, Cella, Harper & Scinto

(57) ABSTRACT

There is provided an integrated circuit having a plurality of circuit blocks. An acquisition unit acquires a request of a reset operation for at least one of the plurality of circuit blocks. A determination unit determines, based on constraining condition information indicating whether or not a reset target circuit block can perform the reset operation simultaneously with another circuit block in which the reset operation is underway, whether or not to instruct the reset target circuit block to perform the reset operation according to the request. An instruction unit instructs the reset target circuit block to start the reset operation according to the request when the determination unit determines to instruct the reset target circuit block to perform the reset operation.

17 Claims, 22 Drawing Sheets

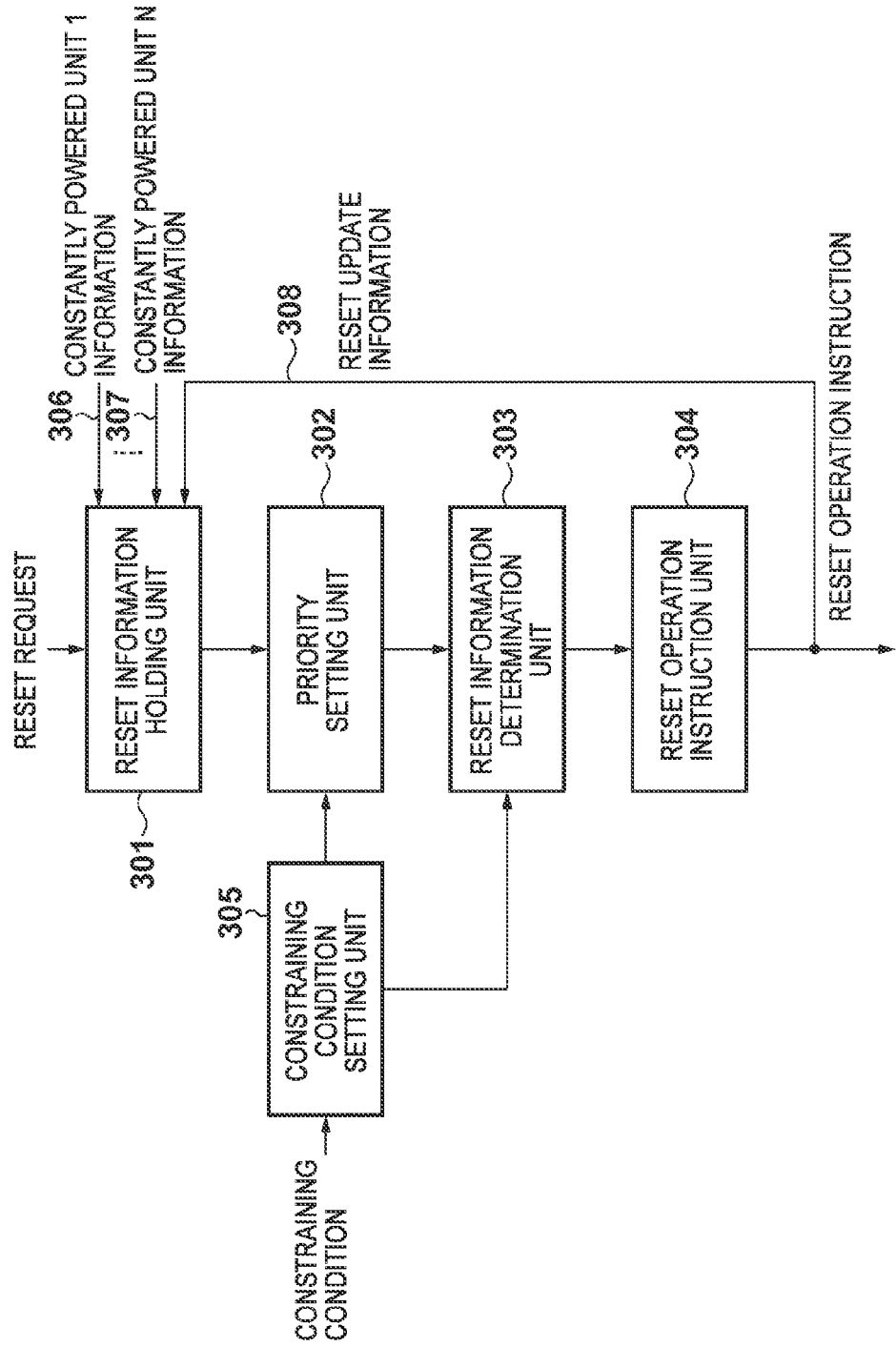

FIG. 4A

|  | RESET REQUEST | UNPROCESSED RESET REQUEST | RESET STATUS | CLOCK STATUS |
|---|---|---|---|---|
| CONSTANTLY POWERED UNIT A | 1 | 0 | 0 | 0 |
| CONSTANTLY POWERED UNIT B | 0 | 0 | 1 | 0 |
| CONSTANTLY POWERED UNIT C | 0 | 0 | 0 | 0 |
| CONSTANTLY POWERED UNIT D | 1 | 0 | 0 | 0 |

FIG. 4B

|  | RESET REQUEST | UNPROCESSED RESET REQUEST | RESET STATUS | CLOCK STATUS |
|---|---|---|---|---|
| CONSTANTLY POWERED UNIT 1 | 1 | 0 | 0 | 0 |
| CONSTANTLY POWERED UNIT 2 | 0 | 0 | 0 | 0 |
| CONSTANTLY POWERED UNIT 3 | 0 | 0 | 0 | 0 |

FIG. 4C

|  | RESET REQUEST | UNPROCESSED RESET REQUEST | RESET STATUS | CLOCK STATUS |
|---|---|---|---|---|
| CONSTANTLY POWERED UNIT 1 | 0 | 0 | 1 | 1 |
| CONSTANTLY POWERED UNIT 2 | 1 | 0 | 0 | 0 |
| CONSTANTLY POWERED UNIT 3 | 0 | 0 | 0 | 0 |

FIG. 4D

|  | RESET REQUEST | UNPROCESSED RESET REQUEST | RESET STATUS | CLOCK STATUS |
|---|---|---|---|---|
| CONSTANTLY POWERED UNIT 1 | 0 | 0 | 1 | 1 |
| CONSTANTLY POWERED UNIT 2 | 0 | 0 | 1 | 1 |
| CONSTANTLY POWERED UNIT 3 | 1 | 0 | 0 | 0 |

FIG. 4E

|  | RESET REQUEST | UNPROCESSED RESET REQUEST | RESET STATUS | CLOCK STATUS |
| --- | --- | --- | --- | --- |
| CONSTANTLY POWERED UNIT 1 | 0 | 0 | 0 | 0 |
| CONSTANTLY POWERED UNIT 2 | 0 | 0 | 1 | 1 |
| CONSTANTLY POWERED UNIT 3 | 0 | 1 | 0 | 0 |

FIG. 4F

|  | RESET REQUEST | UNPROCESSED RESET REQUEST | RESET STATUS | CLOCK STATUS |
| --- | --- | --- | --- | --- |
| CONSTANTLY POWERED UNIT 1 | 0 | 0 | 1 | 1 |
| CONSTANTLY POWERED UNIT 2 | 0 | 0 | 1 | 1 |
| CONSTANTLY POWERED UNIT 3 | 0 | 0 | 1 | 1 |
| CONSTANTLY POWERED UNIT 4 | 1 | 0 | 0 | 0 |

FIG. 4G

|  | RESET REQUEST | UNPROCESSED RESET REQUEST | RESET STATUS | CLOCK STATUS |
| --- | --- | --- | --- | --- |
| CONSTANTLY POWERED UNIT 1 | 0 | 0 | 0 | 0 |
| CONSTANTLY POWERED UNIT 2 | 0 | 0 | 1 | 1 |
| CONSTANTLY POWERED UNIT 3 | 0 | 0 | 1 | 1 |
| CONSTANTLY POWERED UNIT 4 | 0 | 1 | 0 | 0 |

FIG. 4H

|  | RESET REQUEST | UNPROCESSED RESET REQUEST | RESET STATUS | CLOCK STATUS |
| --- | --- | --- | --- | --- |
| CONSTANTLY POWERED UNIT 1 | 0 | 0 | 0 | 0 |
| CONSTANTLY POWERED UNIT 2 | 0 | 0 | 1 | 1 |
| CONSTANTLY POWERED UNIT 3 | 0 | 0 | 0 | 0 |
| CONSTANTLY POWERED UNIT 4 | 0 | 1 | 0 | 0 |

FIG. 5A

|   | 1 | 2 | 3 |
|---|---|---|---|
| CONSTANTLY POWERED UNIT 1 |   | 1 | 0 |
| CONSTANTLY POWERED UNIT 2 | 1 |   | 0 |
| CONSTANTLY POWERED UNIT 3 | 0 | 0 |   |

FIG. 5B

|   | SIMULTANEOUS RESET NG PATTERN |
|---|---|
| CONSTANTLY POWERED UNIT 1 | (2, 3) |
| CONSTANTLY POWERED UNIT 2 | (1, 3) |
| CONSTANTLY POWERED UNIT 3 | (1, 2) |

FIG. 5C

|   | 1 | 2 | 3 | 4 | 5 | 6 | 7 | 8 | 9 |
|---|---|---|---|---|---|---|---|---|---|
| CONTROLLABLY POWERED UNIT 1 |   | 0 | 0 | 0 | 0 | 0 | 0 | 0 | 1 |
| CONTROLLABLY POWERED UNIT 2 | 0 |   | 0 | 0 | 0 | 0 | 0 | 1 | 0 |
| CONTROLLABLY POWERED UNIT 3 | 0 | 0 |   | 0 | 0 | 0 | 1 | 0 | 0 |
| CONTROLLABLY POWERED UNIT 4 | 0 | 0 | 0 |   | 0 | 1 | 0 | 0 | 0 |
| CONTROLLABLY POWERED UNIT 5 | 0 | 0 | 0 | 0 |   | 0 | 0 | 0 | 0 |
| CONTROLLABLY POWERED UNIT 6 | 0 | 0 | 0 | 1 | 0 |   | 0 | 0 | 0 |
| CONTROLLABLY POWERED UNIT 7 | 0 | 0 | 1 | 0 | 0 | 0 |   | 0 | 0 |
| CONTROLLABLY POWERED UNIT 8 | 0 | 1 | 0 | 0 | 0 | 0 | 0 |   | 0 |
| CONTROLLABLY POWERED UNIT 9 | 1 | 0 | 0 | 0 | 0 | 0 | 0 | 0 |   |

FIG. 5D

|   | SIMULTANEOUS RESET NG PATTERN |
|---|---|
| CONTROLLABLY POWERED UNIT 1 | (2, 3, 4), (2, 3, 5), (7, 2), (7, 3), (8, 5) |
| CONTROLLABLY POWERED UNIT 2 | (1, 3, 4), (3, 4), (7, 1), (7, 3), (7, 4) |
| CONTROLLABLY POWERED UNIT 3 | (1, 2, 4), (2, 4), (2, 1, 5), (2, 4, 6), (4, 6, 5) |
| CONTROLLABLY POWERED UNIT 4 | (1, 2, 3), (2, 3), (2, 3, 6), (3, 5, 6), (2, 9), (6, 9) |
| CONTROLLABLY POWERED UNIT 5 | (1, 3, 6), (8, 1), (8, 3) |
| CONTROLLABLY POWERED UNIT 6 | (2, 3, 4), (1, 3, 4), (4, 3, 5), (4, 9) |
| CONTROLLABLY POWERED UNIT 7 | (8, 9), (1, 2), (1, 3), (2, 3) |
| CONTROLLABLY POWERED UNIT 8 | (7, 9), (1, 5), (1, 3), (5, 3) |
| CONTROLLABLY POWERED UNIT 9 | (7, 8), (4, 6), (4, 2), (4, 3) |

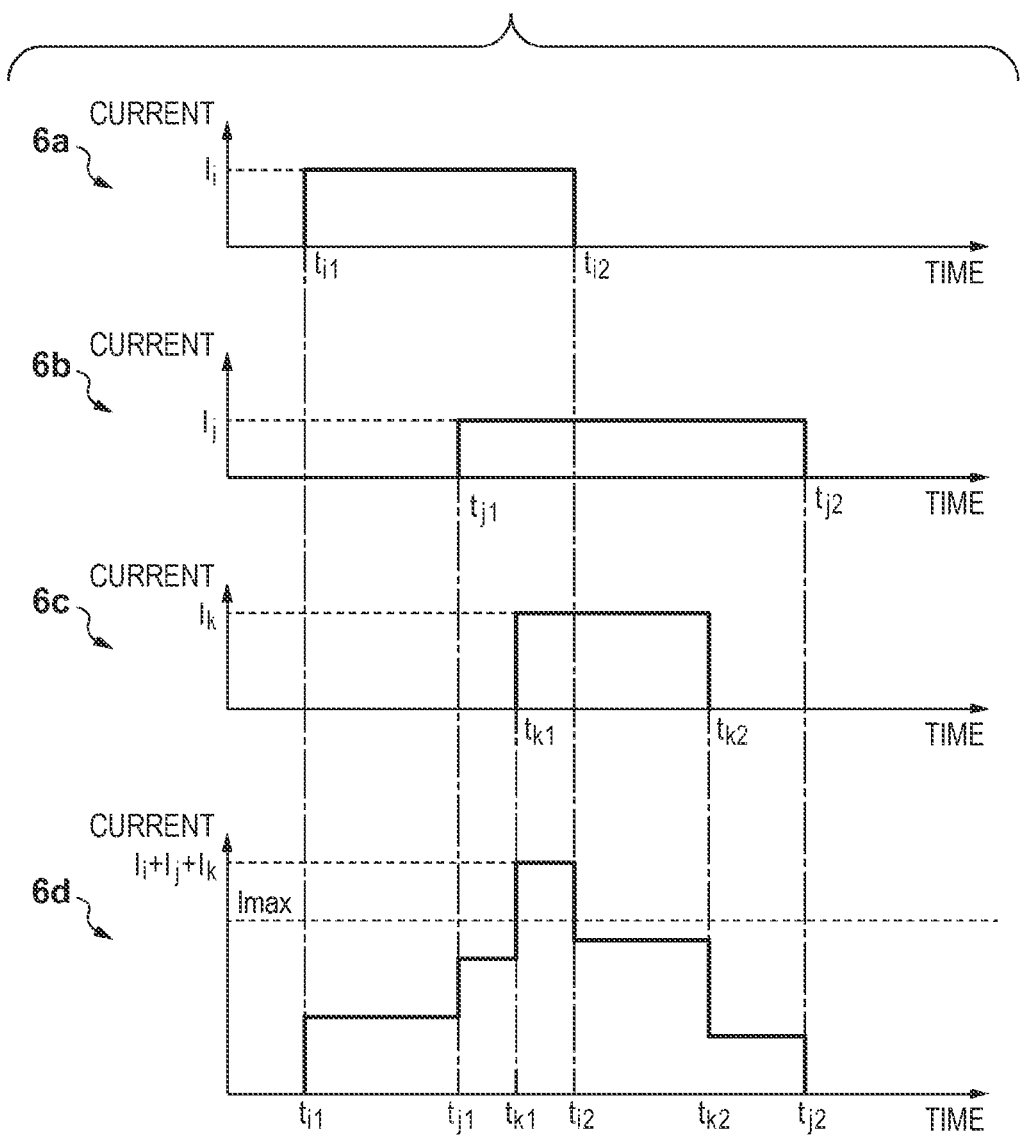

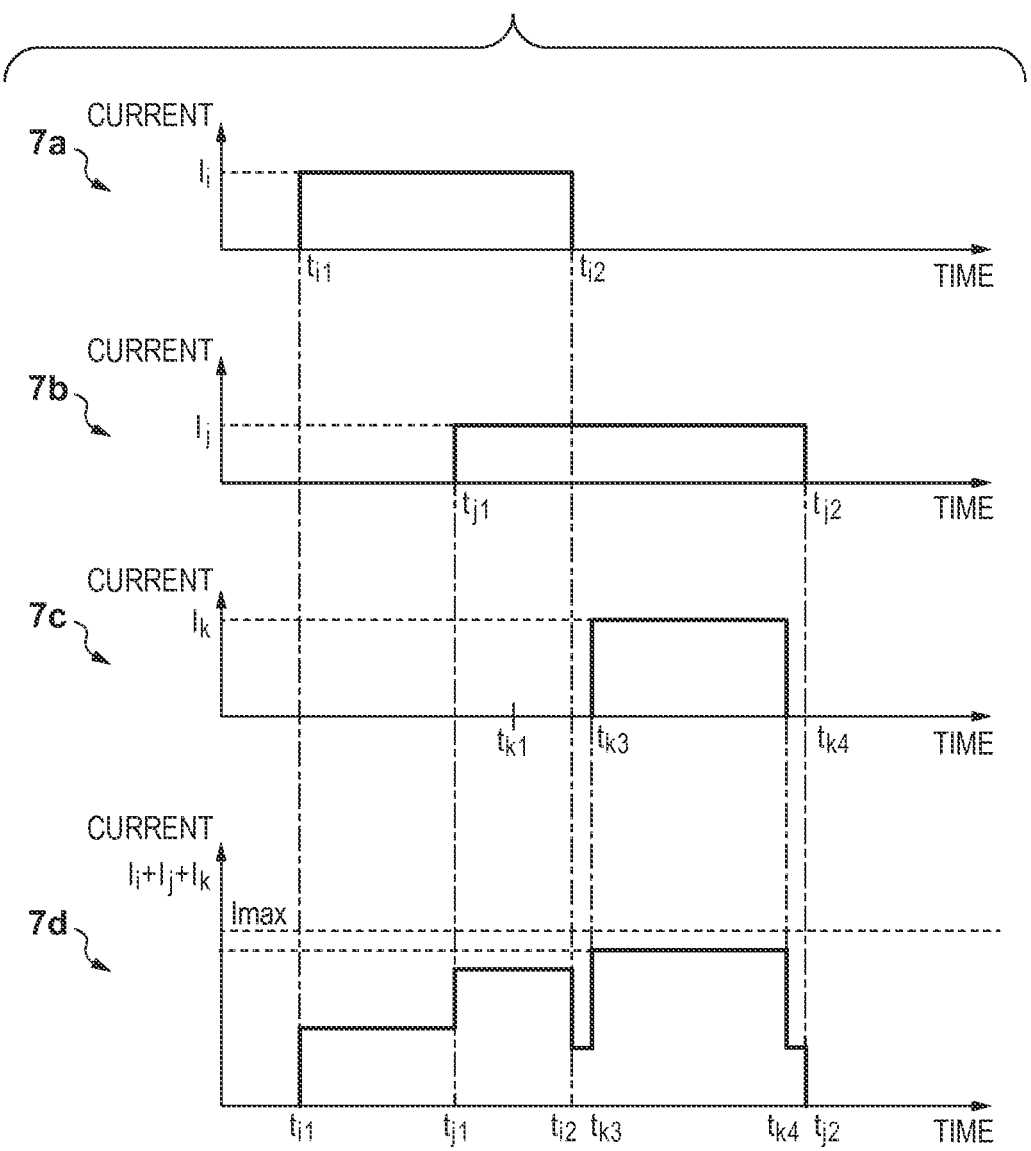

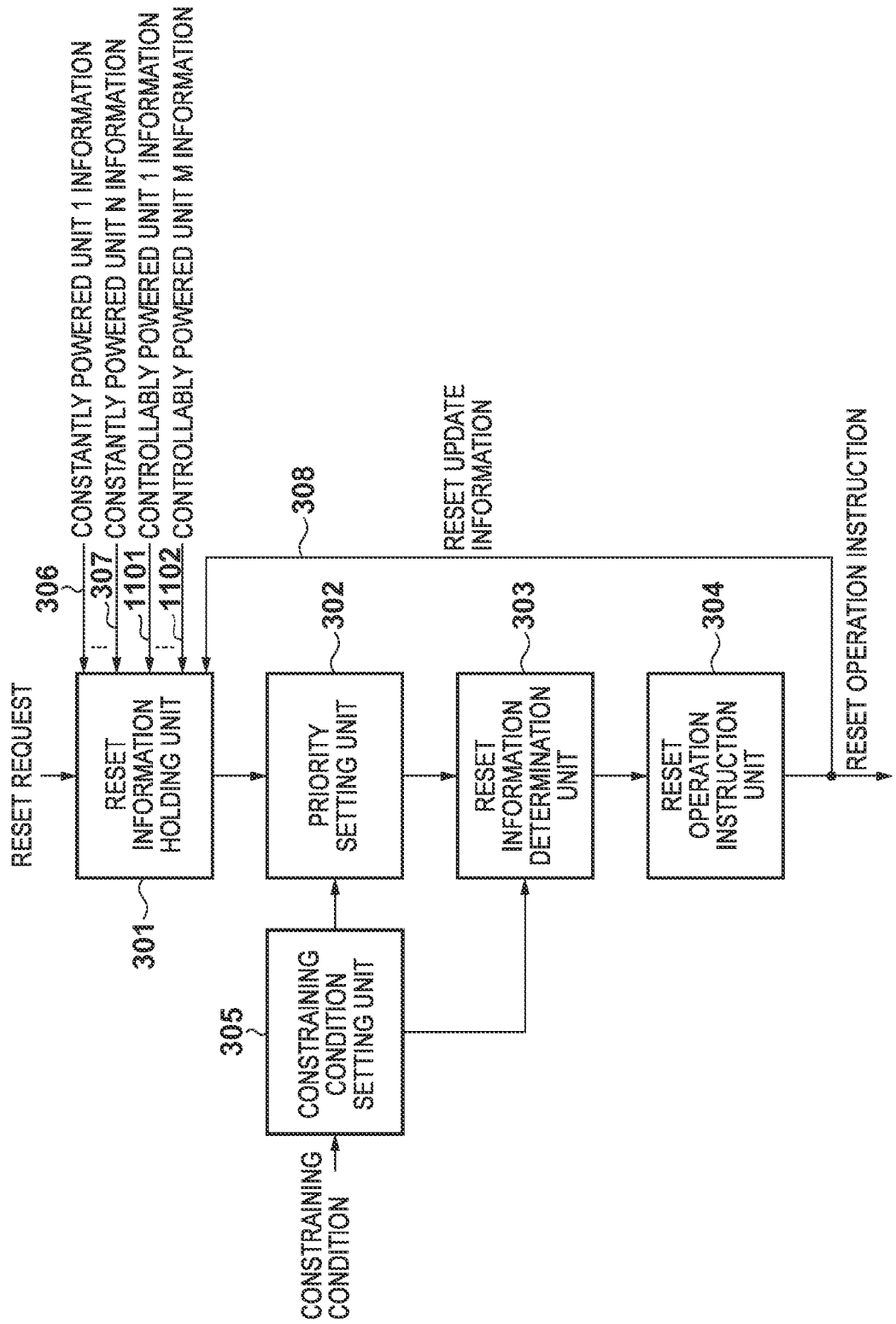

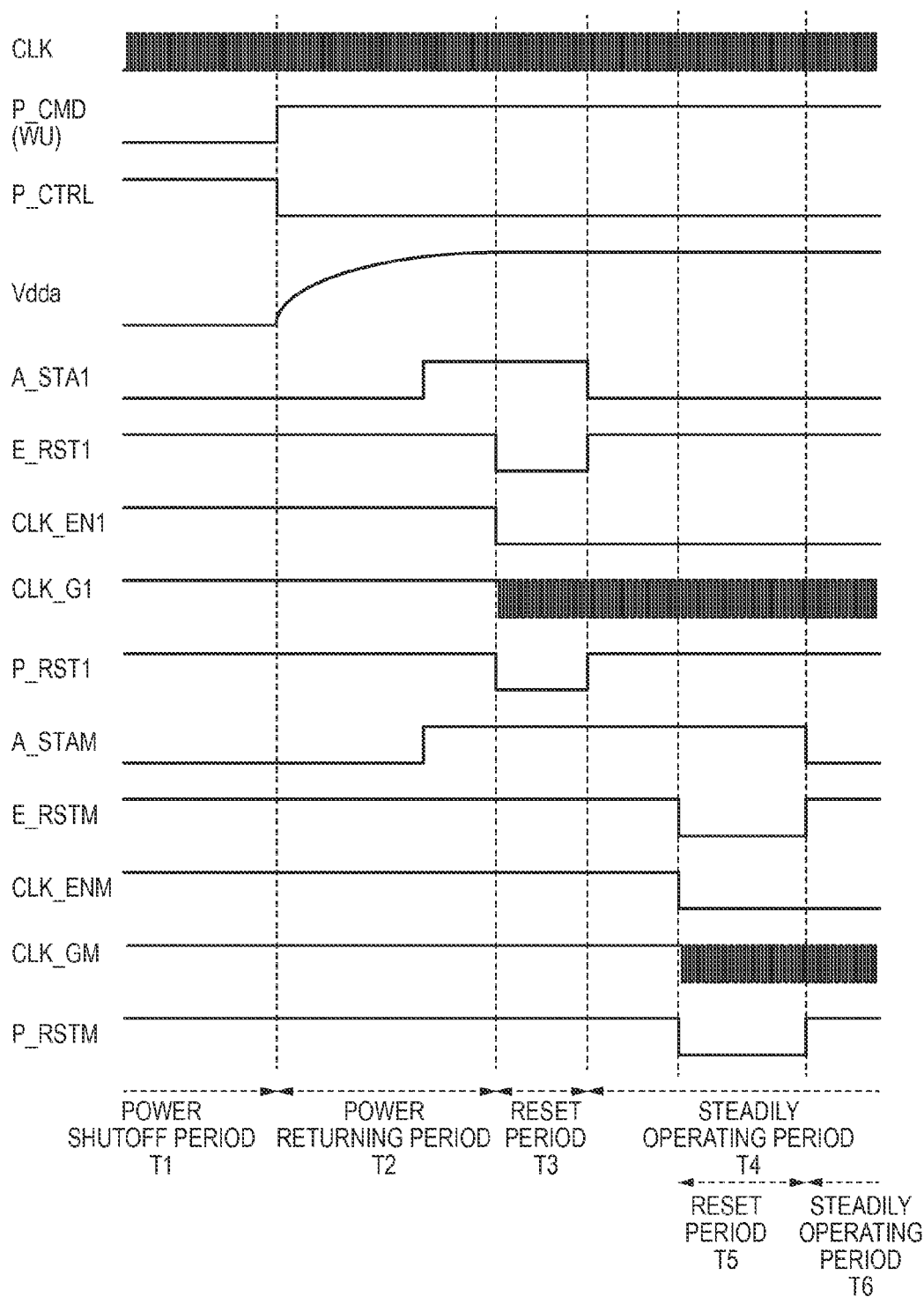

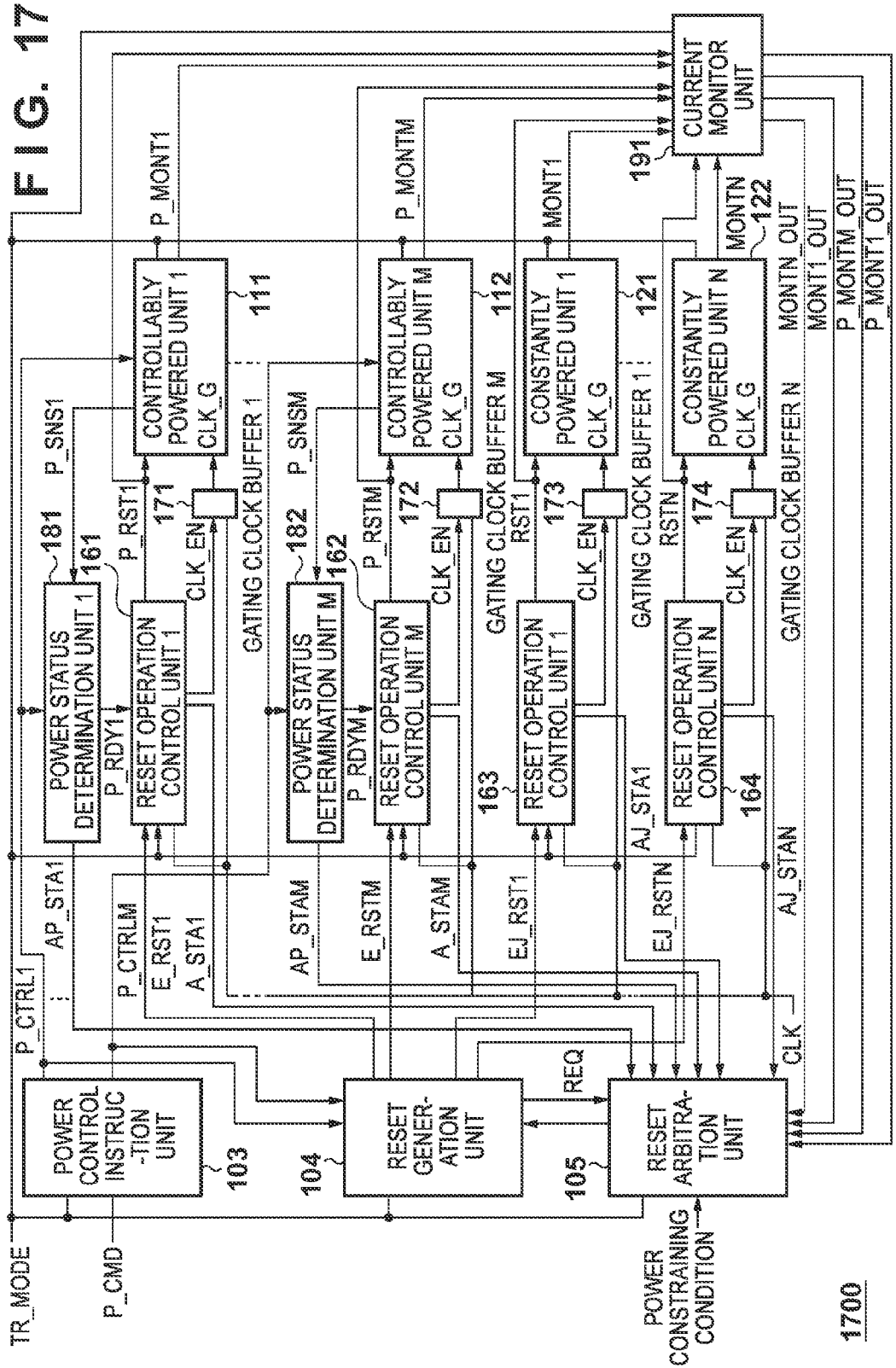

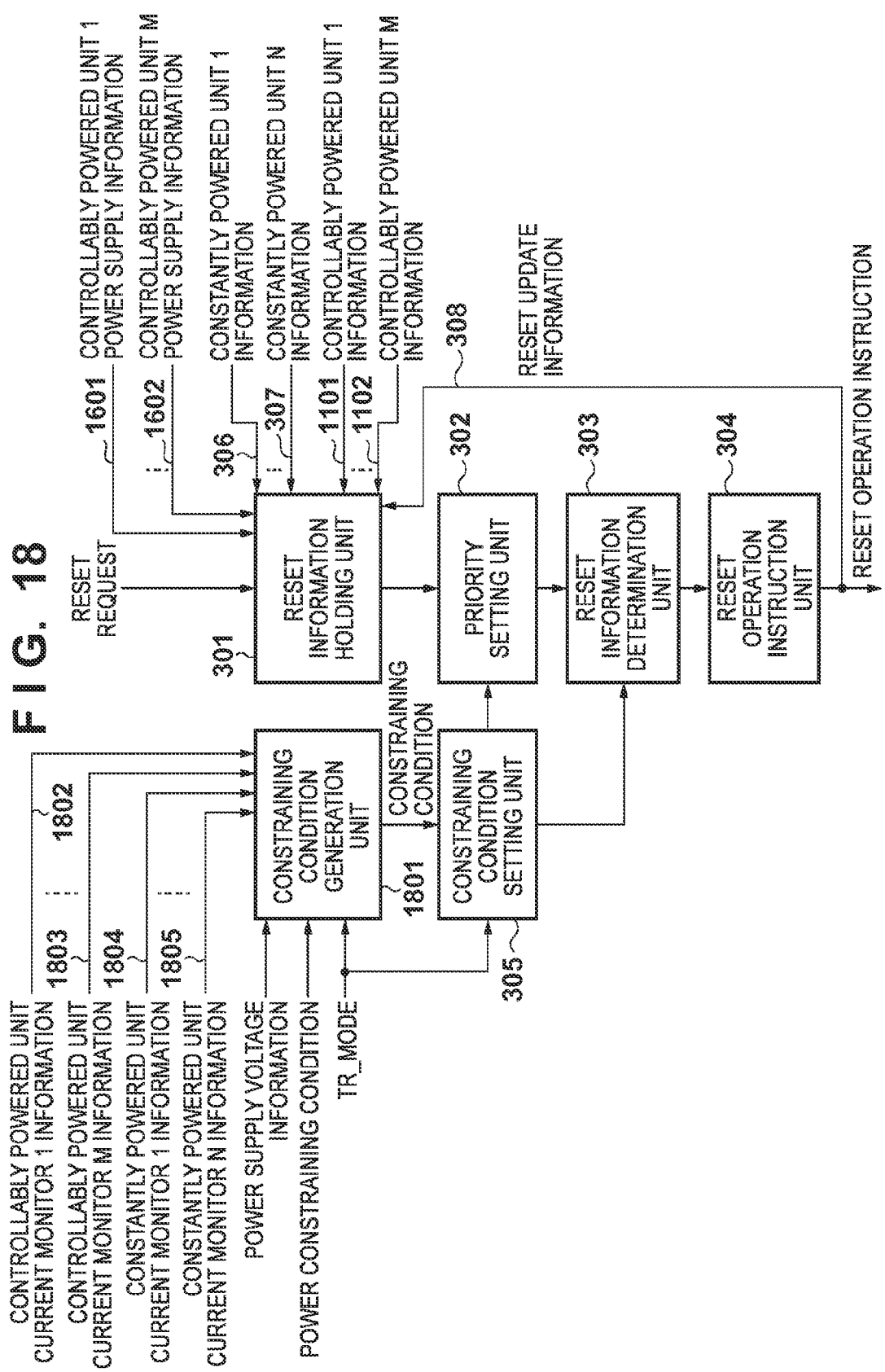

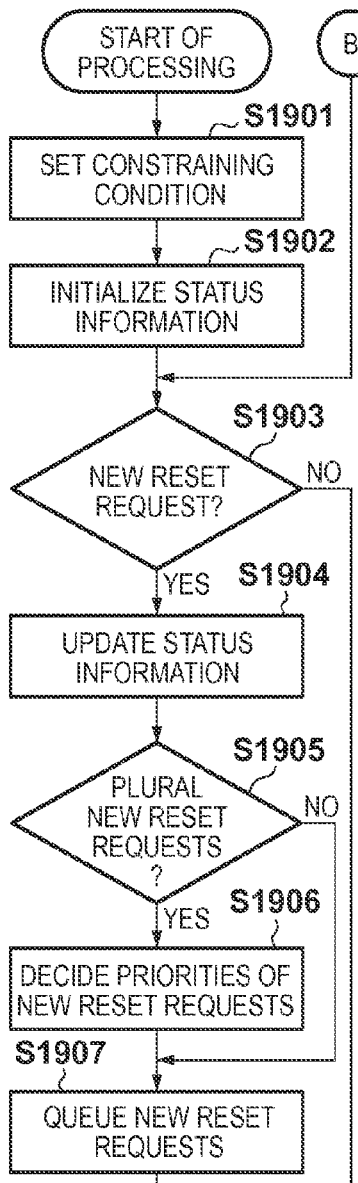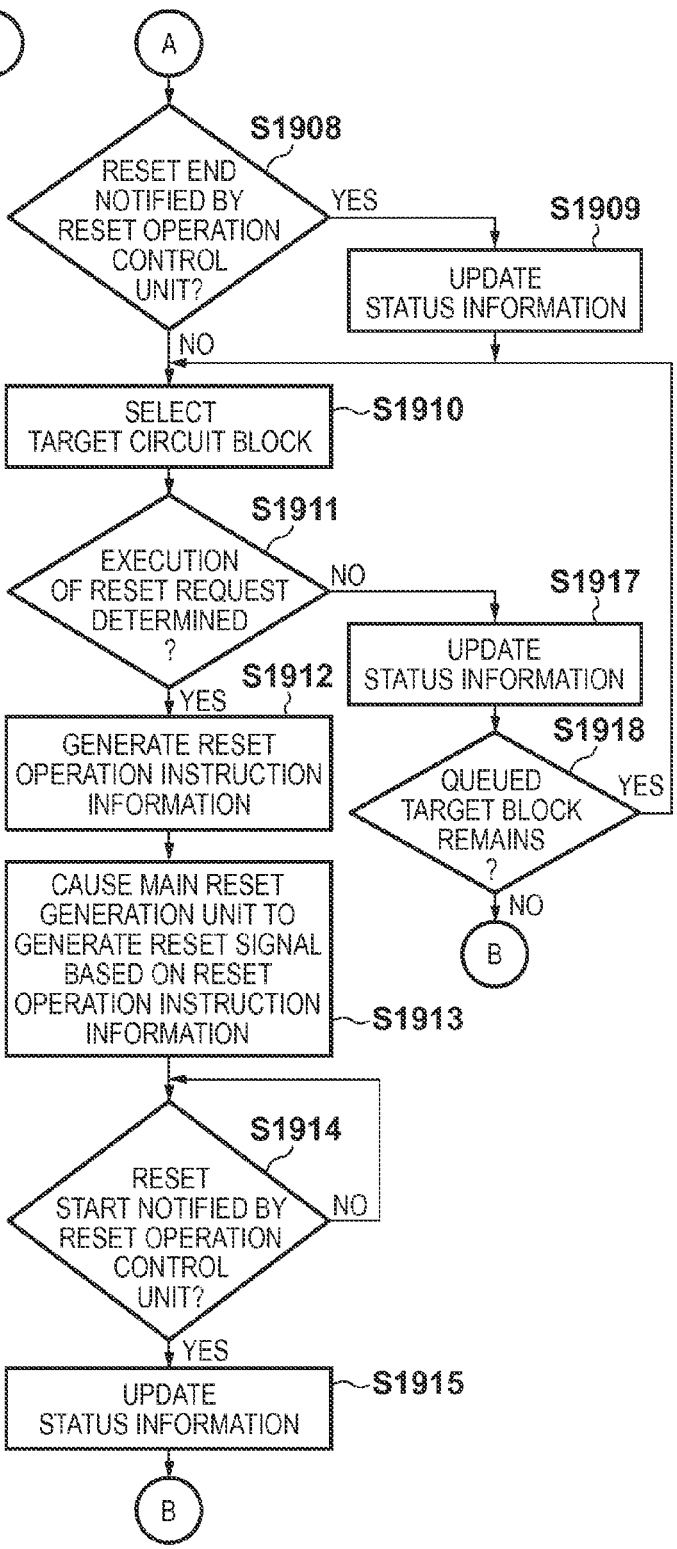

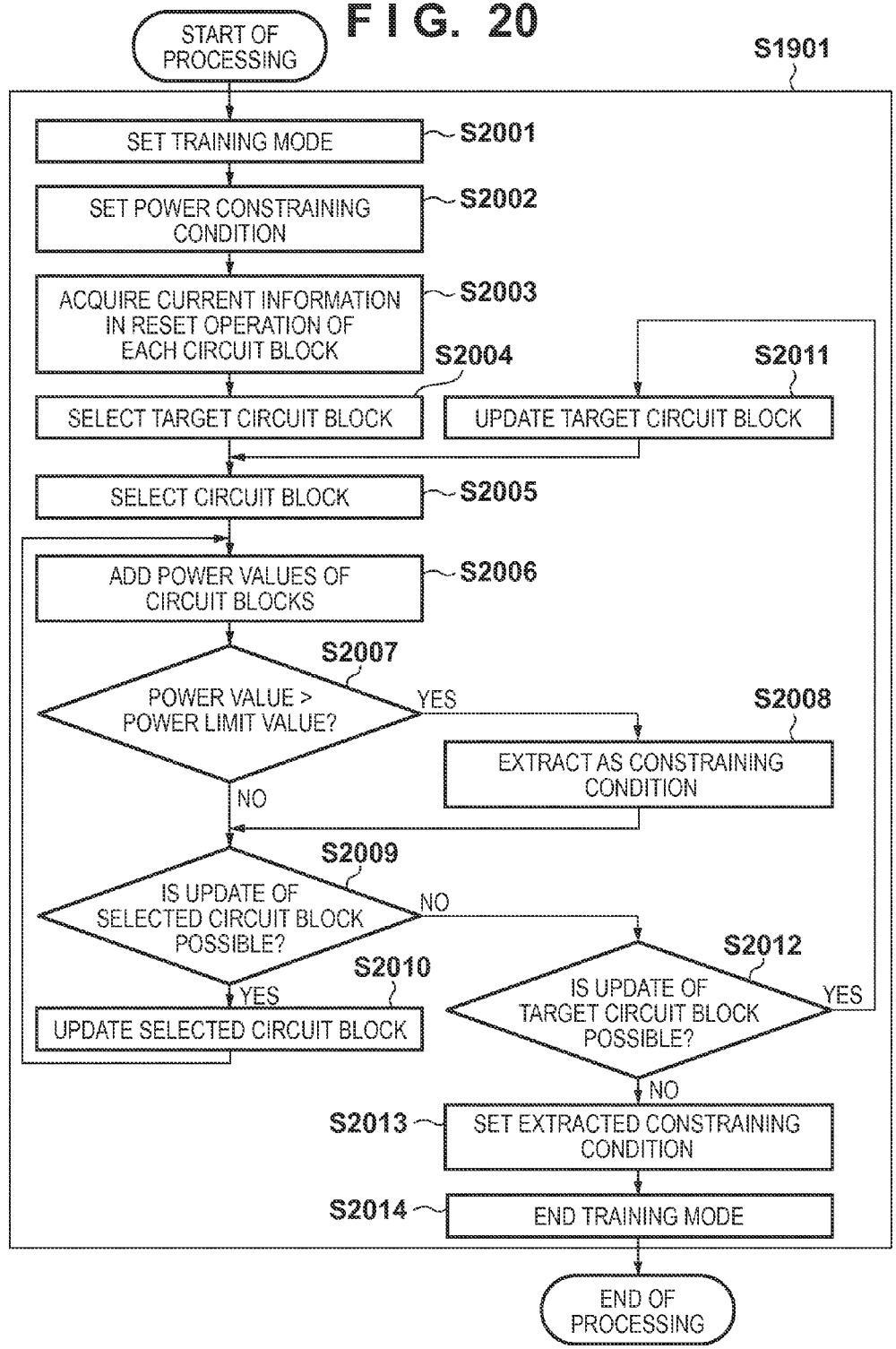

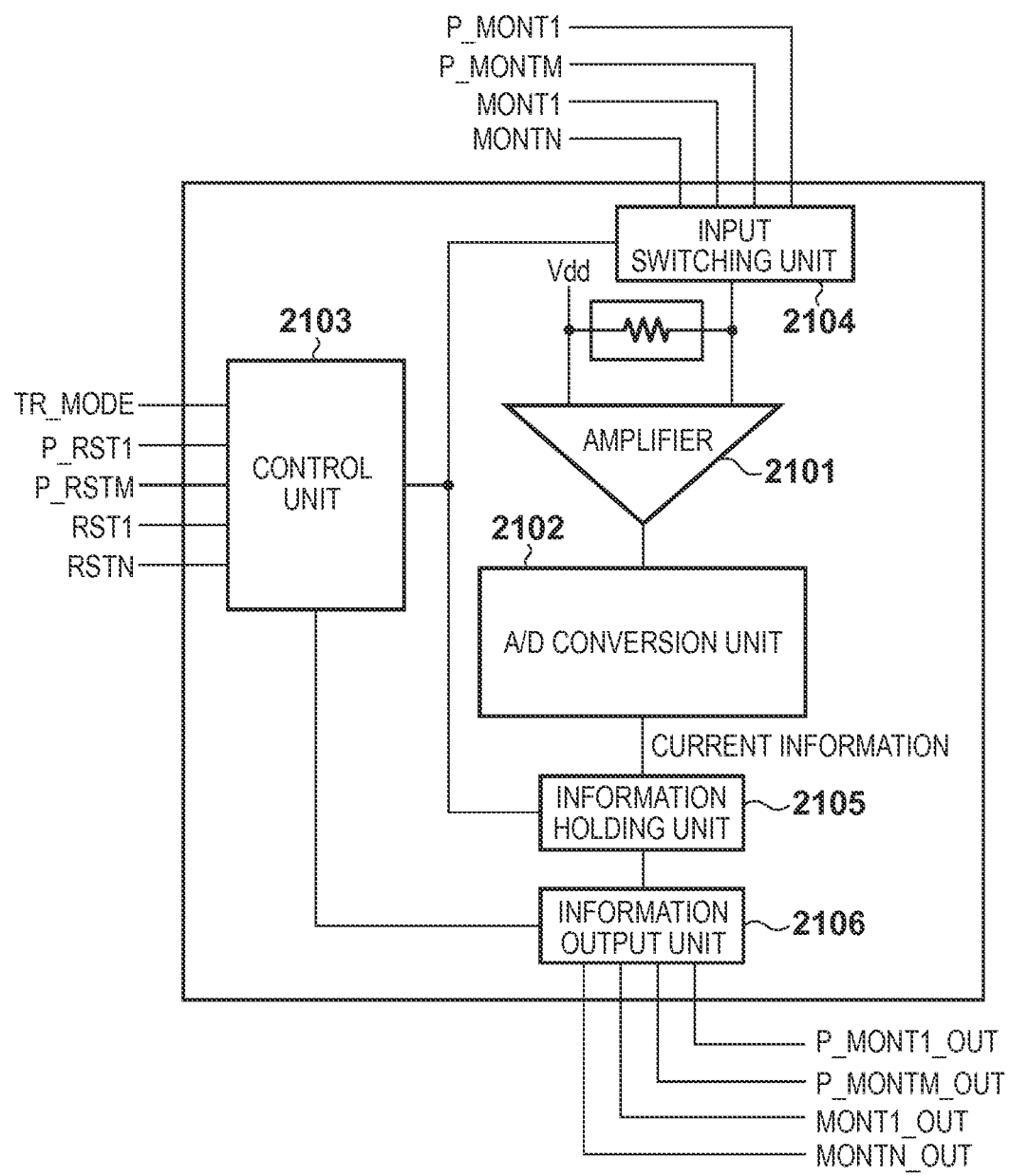

INTEGRATED CIRCUIT AND CONTROL METHOD THEREOF

BACKGROUND OF THE INVENTION

1. Field of the Invention

The present invention relates to an integrated circuit and control method thereof and, more particularly, to reset operation control of a semiconductor integrated circuit.

2. Description of the Related Art

In recent years, a semiconductor integrated circuit which can further reduce power consumption is demanded so as to drive a battery use device for a longer period of time and in consideration of environmental problems. The power consumption of the semiconductor integrated circuit can be classified into a dynamic electric power required for operations and a static electric power required only upon connection of a power source. Since these electric powers are consumed based on different principles, different power saving techniques are respectively used for them.

The dynamic electric power is consumed by currents which flow upon charging/discharging parasitic capacitances caused by signal changes, and currents such as through currents which flow at the time of switching. Therefore, by suppressing signal changes within a trouble-free range of functional operations, the dynamic electric power can be reduced. As a typical power saving method based on such principle, "clock gating" is available, and is popularly used currently.

On the other hand, the static electric power is consumed by charges stored in parasitic capacitances and leak currents. Upon miniaturization of processes, the parasitic capacitances tend to be decreased, but leak currents tend to be increased. Especially, as a polysilicon gate oxide film is thinner, leak currents are exponentially increased at one time. In order to reduce the leak currents, a method of controlling voltages, for example, a power shutoff method is effective. For example, a power switch is arranged between a target circuit and power source, and is controlled to shut off the power source. Even now, the leak currents keep increasing tendency, and the power shutoff control is also important for reducing a power.

However, upon execution of voltage control, initialization is usually required after return, that is, a reset operation usually has to be made before starting an operation. In the reset operation, in order to actively control memory elements such as flip-flops to cause signal changes, clock gating is normally not performed. For this reason, during the reset operation, a larger electric power tends to be consumed than a normal operation status.

In order to suppress power consumption during the reset operation, a method of shortening a reset operation period and a method of lowering an operating ratio are known. For example, Japanese Patent Laid-Open No. 2002-312073 discloses a method of optimizing a time after power ON until reset cancelation by recording a reset cancel timing in a register corresponding to a power shutoff region. Also, Japanese Patent Laid-Open Nos. 2001-101764 and 10-320072 disclose a method of lowering an operating ratio by lowering a clock frequency until a reset signal is negated at a reset timing.

SUMMARY OF THE INVENTION

According to an embodiment of the invention, an integrated circuit comprises: a plurality of circuit blocks; an acquisition unit configured to acquire a request of a reset operation for at least one of the plurality of circuit blocks; a determination unit configured to determine, based on constraining condition information indicating whether or not a reset target circuit block can perform the reset operation simultaneously with another circuit block in which the reset operation is underway, whether or not to instruct the reset target circuit block to perform the reset operation according to the request; and an instruction unit configured to instruct the reset target circuit block to start the reset operation according to the request when the determination unit determines to instruct the reset target circuit block to perform the reset operation.

According to another embodiment of the invention, an integrated circuit comprises: a plurality of circuit blocks; and an arbitration unit configured to arbitrate reset requests for the plurality of circuit blocks based on information of a reset operation status of each circuit block when a plurality of reset requests exist.

According to still another embodiment of the invention, an integrated circuit comprises: a plurality of circuit blocks; a first reset control unit configured to control a reset operation of a component including the plurality of circuit blocks; a plurality of second reset control units configured to control the reset operation of each of the plurality of circuit blocks; and an arbitration unit configured to arbitrate a plurality of reset requests based on a reset request output from the first reset control unit and information of operation statuses of the circuit blocks output from the plurality of second reset control units.

According to yet another embodiment of the invention, a control method of an integrated circuit comprises: acquiring a request of a reset operation for at least one of a plurality of circuit blocks, wherein the integrated circuit comprises the plurality of circuit blocks; determining, based on constraining condition information indicating whether or not a reset target circuit block can perform the reset operation simultaneously with another circuit block in which the reset operation is underway, whether or not to instruct the reset target circuit block to perform the reset operation according to the request; and instructing the reset target circuit block to start the reset operation according to the request when it is determined to instruct the reset target circuit block to perform the reset operation.

According to still yet another embodiment of the invention, a control method of an integrated circuit comprises: arbitrating reset requests for a plurality of circuit blocks based on information of a reset operation status of each circuit block when a plurality of reset requests exist, wherein the integrated circuit comprises the plurality of circuit blocks.

Further features of the present invention will become apparent from the following description of exemplary embodiments (with reference to the attached drawings).

BRIEF DESCRIPTION OF THE DRAWINGS

FIG. 3 is a block diagram showing an example of a reset arbitration unit 105 according to the first embodiment;

FIGS. 4A to 4H are tables showing examples of status information;

FIGS. 5A to 5D are tables showing constraining conditions;

FIG. 6 shows graphs showing current values when a method of the first embodiment is not used;

FIG. 7 shows graphs showing current values when the method of the first embodiment is used;

FIG. 11 is a block diagram showing an example of a reset arbitration unit 105 according to the second embodiment;

FIG. 12 is a timing chart when the method of the second embodiment is used;

FIG. 17 is a block diagram showing an example of a semiconductor integrated circuit according to the fourth embodiment;

FIG. 18 is a block diagram showing an example of a reset arbitration unit 105 according to the fourth embodiment;

FIGS. 19A and 19B are flowcharts showing the operation of the reset arbitration unit 105 according to the first embodiment;

FIG. 20 is a flowchart showing the operation in a training mode according to the fourth embodiment; and FIG. 21 is a block diagram showing an example of a current monitor unit 191 according to the fourth embodiment.

DESCRIPTION OF THE EMBODIMENTS

In a semiconductor integrated circuit having a plurality of circuit blocks, a control unit required to control reset operations of respective circuit blocks tends to be distributed in view of easy wirings and power consumption. However, since reset start timings of respective circuit blocks may vary depending on the functions of the circuit blocks, reset timings of a plurality of circuit blocks may often match accidentally. In this case, for example, power consumption, voltage drop, or the like may often exceed an allowable value.

According to some embodiments, in an integrated circuit having a plurality of circuit blocks, reset operation timings can be appropriately controlled.

Figure 13A:
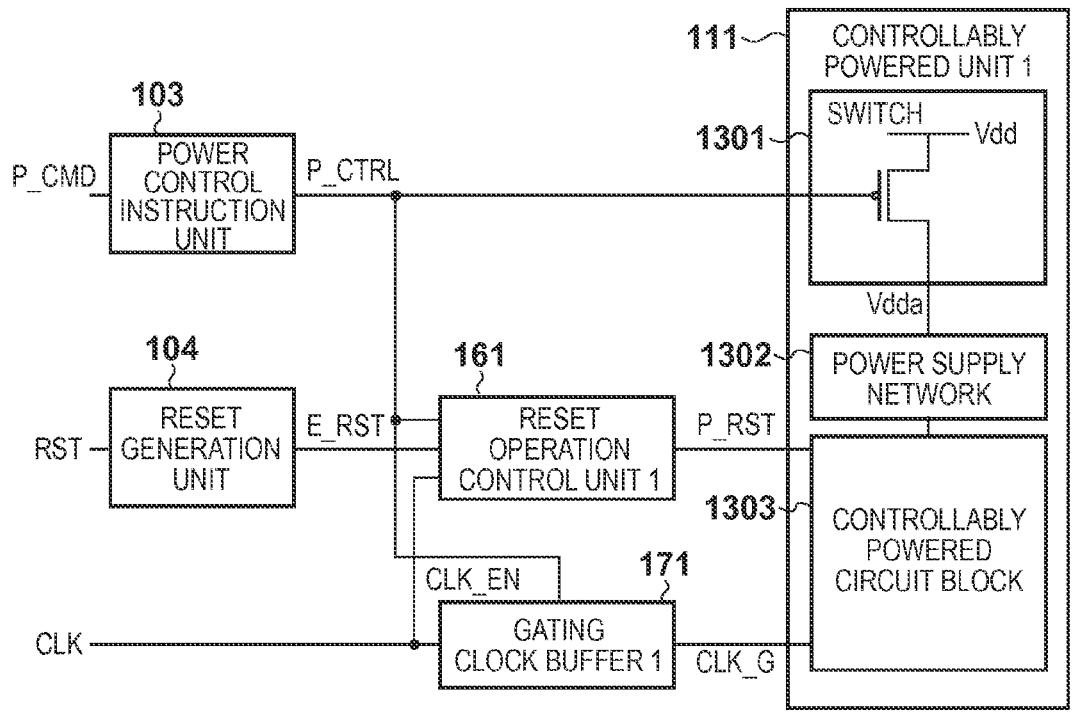
FIGS. 13A and 13B are block diagrams showing examples of the arrangements required to optimize a reset operation period.
Figure 14A:
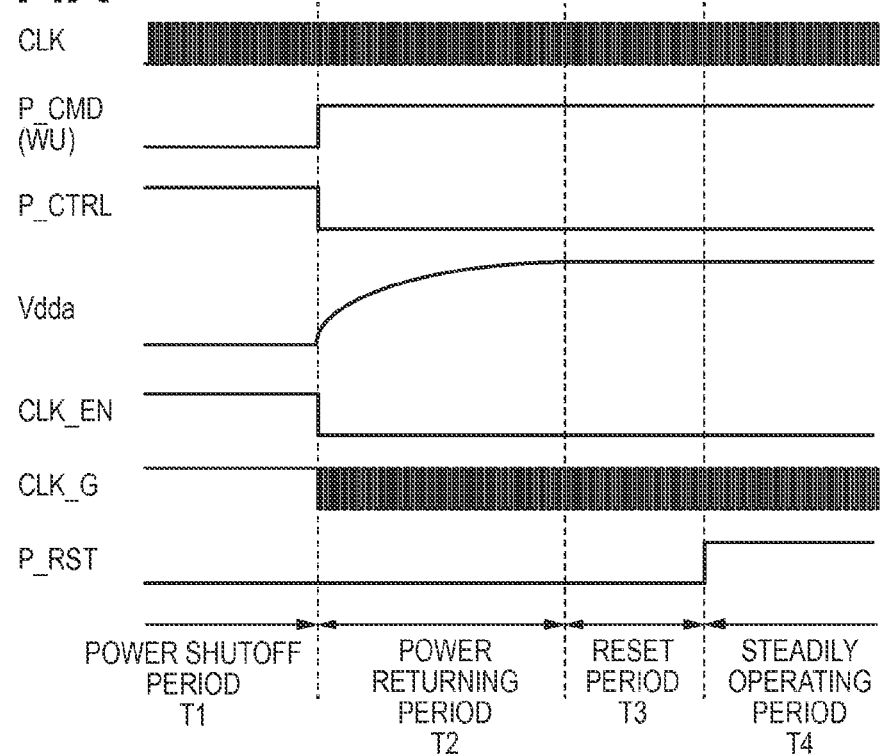
FIGS. 14A and 14B are timing charts of a reset operation.

A method of suppressing power consumption at a reset timing by controlling a reset period, which method is used in the following embodiments, will be described first. FIG. 13A shows an arrangement example required to implement such method. Also, FIG. 14A is a timing chart showing the operation of the arrangement shown in FIG. 13A. To the arrangement shown in FIG. 13A, a clock signal CLK is externally supplied. When a power control instruction unit 103 receives a power control instruction signal P_CMD during a power shutoff period T1, a power returning period T2 is started. More specifically, the power control instruction unit 103 turns on a switch 1301 of a controllably powered unit 1 111. Then, a power source Vdda begins to supply an electric power to a power supply network 1302. When a power returning instruction is issued by the power control instruction signal P_CMD, the power control instruction unit 103 controls a gating clock buffer 171 by a clock control signal CLK_EN to activate clock transmission. When the power source is stabilized, the control enters a reset period T3. A reset operation control unit 161 adjusts timings T2 and T3 from the power returning instruction by the power control instruction signal P_CMD until reset cancelation. When the reset operation control unit 161 cancels a signal P_RST, the control enters a steadily operating period T4. During the steadily operating period T4, clock gating can be controlled as needed. According to this example, since clock gating is negated during the power returning period T2 and reset period T3, an electric power is consumed.

Figure 13B:
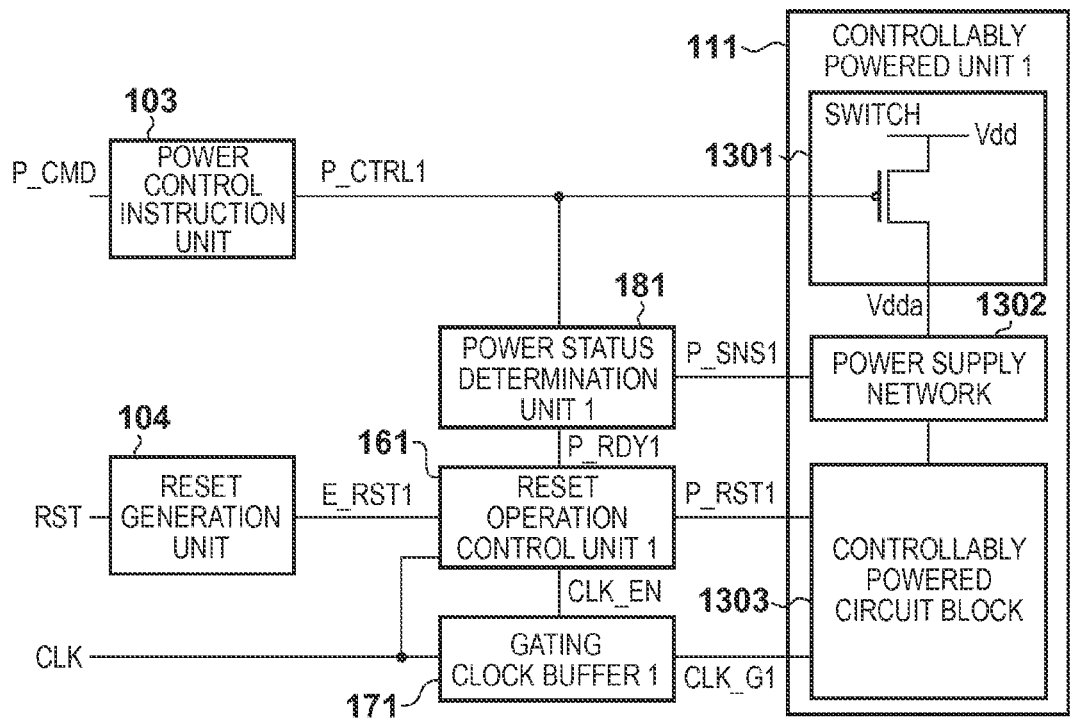
Figure 14B:
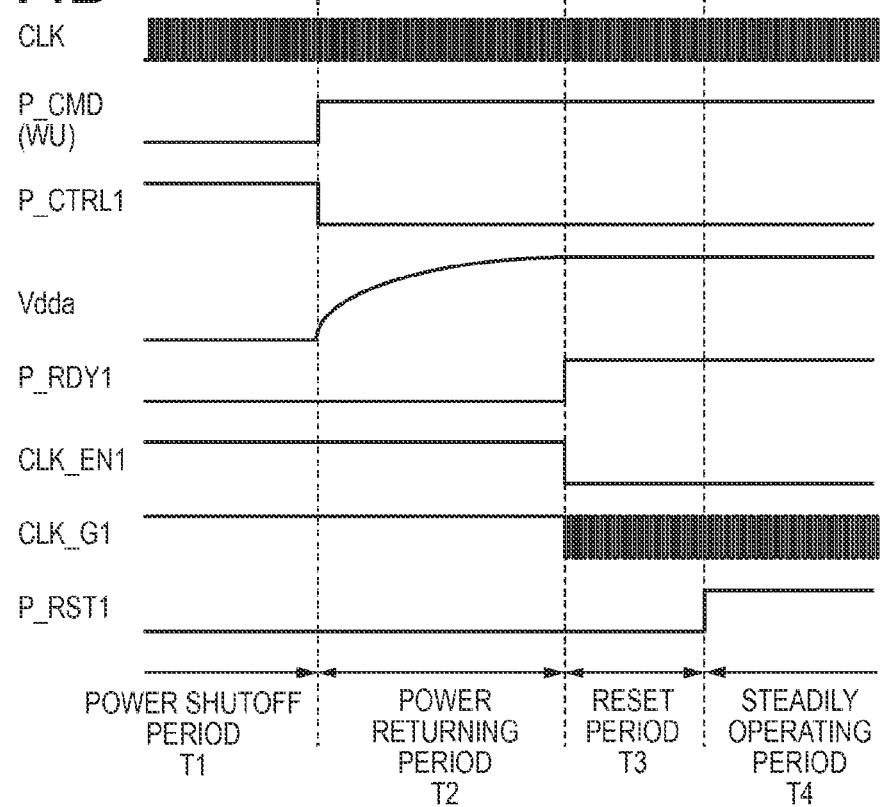

The arrangement shown in FIG. 13B is an arrangement example required to precisely detect a power returning timing. FIG. 14B is a timing chart showing the operation of the arrangement shown in FIG. 13B. Differences from the arrangement shown in FIG. 13A lie in that a power status determination unit 181 is added, and the power status determination unit 181 controls the reset operation control unit 161 using a signal P_RDY1. More specifically, the power status determination unit 181 determines a status of an electric power supply to a circuit block 1303. Then, after the power source is stabilized, the power status determination unit 181 transmits the signal P_RDY1 required to control a reset operation to the reset operation control unit 161. The reset operation control unit 161 controls the gating clock buffer 171 using a clock control signal CLOCK_EN1 according to the signal P_RDY1, thus activating clock transmission. Also, the reset operation control unit 161 adjusts a timing T3 after a reset instruction by the signal P_RDY1 until reset cancelation, and cancels a signal P_RST1. According to this example, since clock gating is negated during the reset period T3, an electric power is consumed.

When the aforementioned reset period control is executed, at least one of the timings T2 and T3 is optimized to shorten a negate period of clock gating, thus reducing power consumption. The timing charts shown in FIGS. 14A and 14B are presented only for the exemplary purpose. For example, signals P_CTRL, CLK_EN, CLK_EN1, P_RST, P_RST1, and the like are negative signals, but the same operation can be implemented irrespective of the polarities of signals. The gating clock buffer 171 used to negate clock transmission is implemented using OR logics. However, the same operation can be implemented using AND logics.

First Embodiment

Figure 1:
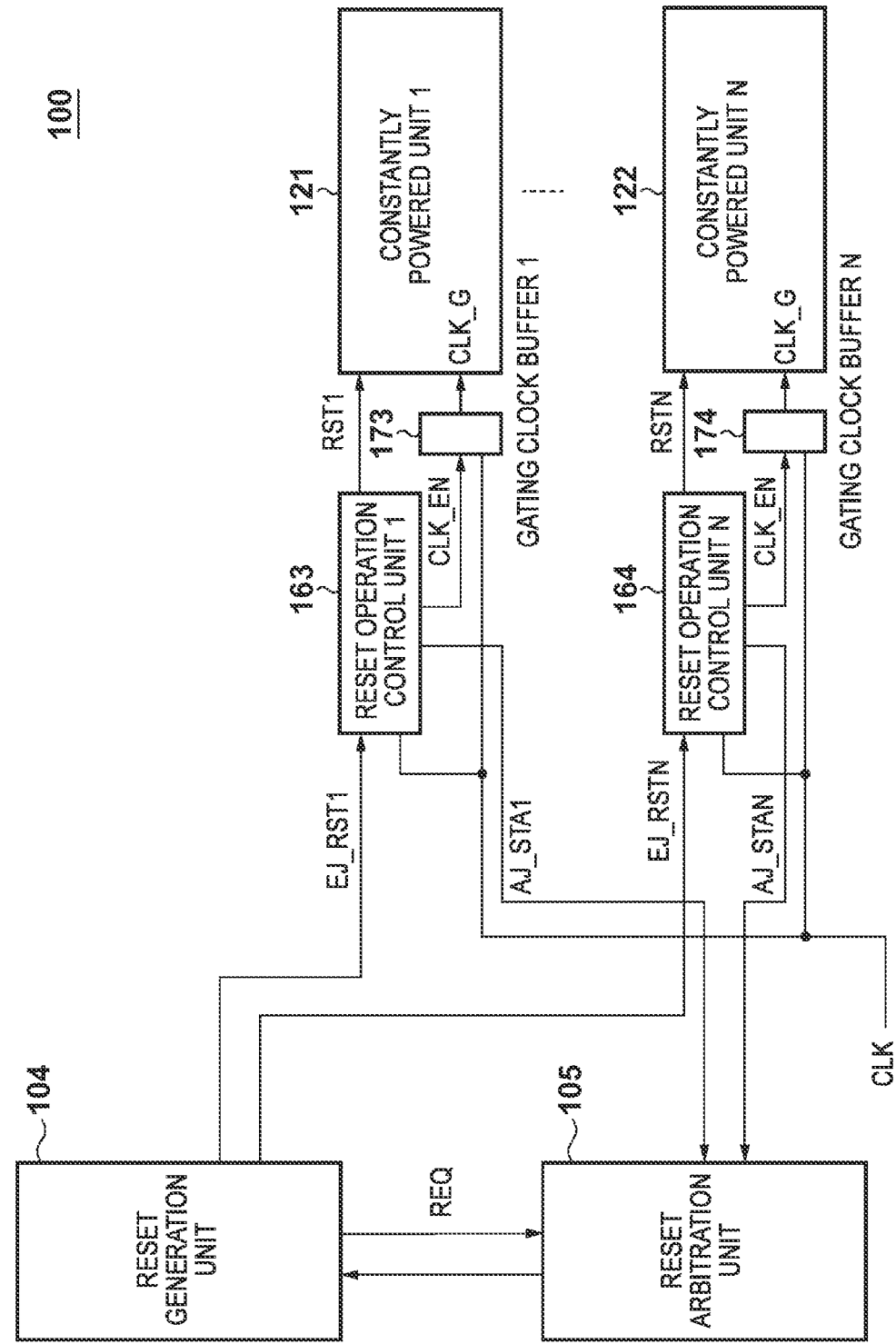
FIG. 1 is a block diagram showing an example of a semiconductor integrated circuit according to the first embodiment.

A semiconductor integrated circuit according to the first embodiment will be described below. According to this embodiment, reset operation timings of respective circuit blocks can be appropriately controlled by arbitrating reset operation requests (reset requests) from a plurality of circuit blocks. In this case, arbitration is made based on information of reset operations for respective circuit blocks. FIG. 1 partially shows a semiconductor integrated circuit 100 according to this embodiment. The semiconductor integration circuit 100 includes a plurality of circuit blocks and a reset circuit. In this embodiment, the semiconductor integrated circuit 100 includes a constantly powered unit 1 121, constantly powered unit N 122, and constantly powered units 2 to N−1 (not shown) as the circuit block. In this case, N is an integer not less than 2.

The reset circuit includes a reset generation unit 104, reset arbitration unit 105, reset operation control units 1 163 to N 164, and gating clock buffers 1 173 to N 174. The reset operation control units 1 163 to N 164 are respectively connected to the constantly powered units 1 121 to N 122 to be able to communicate with each other. The gating clock buffers 1 173 to N 174 are also respectively connected to the reset operation control units 1 163 to N 164 and constantly powered units 1 121 to N 122 to be able to communicate with each other.

The constantly powered units 1 121 to N 122 are respectively portions of the semiconductor integrated circuit, and are those (circuit blocks) which are constantly powered. Each of the constantly powered units 1 121 to N 122 can independently perform a reset operation under the control of the reset circuit.

The reset arbitration unit 105 acquires operation information AJ_STA for the constantly powered units 1 121 to N 122 from the reset operation control units 1 163 to N 164 corresponding to the constantly powered units 1 121 to N 122. More specifically, the reset arbitration unit 105 can acquire information indicating a reset operation status of each of the constantly powered units 1 121 to N 122 and that indicating a clock supply status. Also, the reset arbitration unit 105 arbitrates reset signals to be transmitted to the constantly powered units 1 121 to N 122 according to a REQ signal from the reset generation unit 104. This arbitration is performed according to a reset request output from the reset generation unit 104 and operation information for each of the constantly powered units 1 121 to N 122.

The reset generation unit 104 is connected to the reset arbitration unit 105 and reset operation control units 1 163 to N 164 to be able to communicate with each other. More specifically, the reset generation unit 104 can transmit signals EJ_RST to the reset operation control units 1 163 to N 164, so as to instruct the constantly powered units 1 121 to N 122 to perform reset operations. The signals which instruct to perform reset operations are transmitted according to arbitration of reset requests by the reset arbitration unit 105. For example, the reset generation unit 104 can generate reset requests for the respective constantly powered units 1 121 to N 122 at a power-ON timing of the integrated circuit. Also, the reset generation unit 104 can generate reset requests for arbitrary ones of the constantly powered units 1 121 to N 122 even during the operation of the integrated circuit. The reset arbitration unit 105 arbitrates reset requests generated in this way, and the reset generation unit 104 transmits the signals, which instruct to perform reset operations, according to the arbitration result. In this manner, the reset generation unit 104 controls reset operations of the arrangement including the plurality of circuit blocks (first reset control).

Each of the reset operation control units 1 163 to N 164 is connected to one or more constantly powered units 1 121 to N 122, and controls reset operations of the connected constantly powered units 1 121 to N 122. Then, according to instructions from the reset generation unit 104, the reset operation control units 1 to N control the constantly powered units 1 121 to N 122 to start reset operations. In this way, the reset operation control units 1 163 to N 164 control reset operations for the plurality of circuit blocks (second reset control). More specifically, the reset operation control units 1 163 to N 164 transmit reset signals RST1 to RSTN to the corresponding constantly powered units 1 121 to N 122. According to the reset signals, the constantly powered units 1 121 to N 122 perform reset operations at timings controlled by the reset generation unit 104 and reset arbitration unit 105. Also, the reset operation control units 1 163 to N 164 transmit clock enable signals CLK_EN to the gating clock buffers 1 173 to N 174.

Figure 2A:
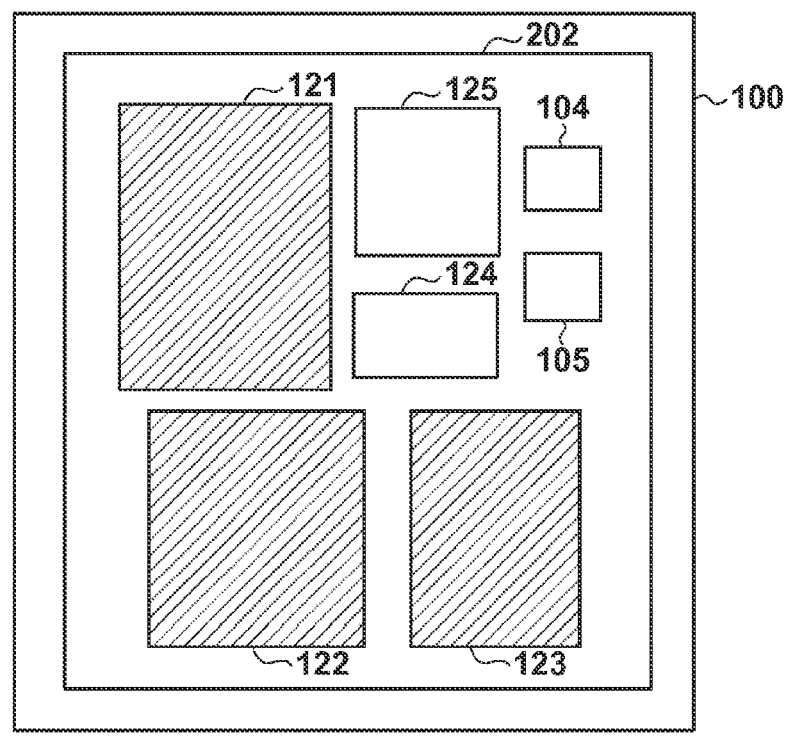
FIGS. 2A and 2B are views showing schematic floor plan examples of the semiconductor integrated circuit.

FIG. 2A shows a schematic floor plan example of the semiconductor integrated circuit 100 according to this embodiment. In a logic core region 202 of the semiconductor integrated circuit 100, the plurality of constantly powered units 121 to 123 are allocated. Also, in the logic core region 202, the reset generation unit 104 and reset arbitration unit 105, and other regions 124 and 125 are allocated. Although not shown in FIG. 2A, the reset operation control units 1 163 to N 164 and gating clock buffers 1 173 to N 174 are allocated as needed. In this case, for example, the reset operation control unit 1 163 and gating clock buffer 1 173 are allocated in the vicinity of the constantly powered unit 1 121, thus controlling the operation timing more precisely.

FIG. 3 shows an internal arrangement example of the reset arbitration unit 105. The reset arbitration unit 105 includes a reset information holding unit 301, priority setting unit 302, reset information determination unit 303, reset operation instruction unit 304, and constraining condition setting unit 305.

The reset information holding unit 301 acquires reset requests for one or more of the constantly powered units 1 to N. Also, the reset information holding unit 301 inputs pieces of information 306 and 307 about the constantly powered units 1 to N from the reset operation control units 1 163 to N 164. These pieces of information 306 and 307 include information indicating reset operation statuses of the constantly powered units 1 121 to N 122 (for example, information as to whether or not a reset operation is underway), and information indicating clock supply statuses.

The constraining condition setting unit 305 sets constraining conditions (constraining information) required to control reset timings. The constraining conditions will be described later with reference to FIGS. 5A to 5D. Furthermore, the constraining condition setting unit 305 transmits order information (priority information) required to decide priorities to the priority setting unit 302, and transmits the constraining conditions to the reset information determination unit 303. The order information defines priorities of the constantly powered units to be reset, which are used when reset operation timings of the constantly powered units overlap each other. For example, this order information can be ID numbers used to identify the respective constantly powered units. In this case, the constantly powered units to be reset can be decided according to the magnitudes of the ID numbers. Alternatively, the order information may include numbers which are given according to gate scale sizes to the respective constantly powered units. In this case, the constantly powered units to be reset can be decided according to the magnitudes of the numbers.

The priority setting unit 302 is accessible to the order information. When a plurality of reset requests are input to the reset information holding unit 301, the priority setting unit 302 decides priorities of the reset requests. As described above, the priority setting unit 302 acquires the order information from the constraining condition setting unit 305.

The reset information determination unit 303 determines with reference to the constraining conditions whether or not a circuit block as a reset target according to a reset request can perform a reset operation. More specifically, the reset information determination unit 303 decides to execute or delay a reset operation according to the pieces of information 306 and 307 input to the reset information holding unit 301, the decided order of a reset request decided by the priority setting unit 302, and the constraining conditions acquired from the constraining condition setting unit 305.

When the reset information determination unit 303 determines that a circuit block as a reset target according to a reset request can perform a reset operation, the reset operation instruction unit 304 transmits a reset operation instruction to the reset generation unit 104. Also, the reset operation instruction unit 304 transmits reset update information 308 to the reset information holding unit 301.

With the above arrangement, reset operation start and end timings are controlled according to the pieces of information 306 and 307 about the constantly powered units 1 to N transmitted from the reset operation control units 1 163 to N 164.

Information to be held by the reset information holding unit 301 will be described below with reference to FIGS. 4A to 4H. FIGS. 4A to 4H show "reset request" information, "unprocessed reset request" information, "reset status" information, and "clock status" information of each of the constantly powered units 1 121 to N 122. These pieces of information are updated by operations (to be described later) of the respective units shown in FIG. 3 or signals input to the reset information holding unit 301.

"Reset request" indicates that the constantly powered unit is requested to be reset. "Unprocessed reset request" indicates that the constantly powered unit was requested to be reset previously, but that reset operation is delayed by the reset information determination unit 303. More specifically, when a plurality of reset requests are generated simultaneously, and when the reset information determination unit 303 delays a reset operation, "unprocessed reset request" is activated. For example, when a plurality of reset requests are generated simultaneously, and when a reset operation corresponding to a reset request with a high priority is started, "unprocessed reset request" corresponding to a reset request with a low priority is activated. When a reset request is queued, and when the reset information determination unit 303 delays a reset operation, "unprocessed reset request" is also activated. "Reset status" indicates that a reset operation of the constantly powered unit is underway. "Clock status" indicates that clock transmission to the constantly powered unit is made. In FIGS. 4A to 4E, "1" indicates "active".

The operation of the reset arbitration unit 105 will be described below with reference to the flowcharts shown in FIGS. 19A and 19B. In step S1901, the constraining condition setting unit 305 sets constraining conditions. The constraining conditions include information as to whether or not a circuit block as a reset target can perform a reset operation simultaneously with another circuit block, the reset operation of which is underway. The constraining condition setting method is not particularly limited. The constraining conditions may be decided and fixed in advance. The constraining conditions may be set via the user or a control circuit. For example, the constraining conditions may be set via registers or the like, or may be read out from a memory or the like. For example, the constraining conditions may be set according to current values at reset operation timings of the constantly powered units, which are detected by a current monitor.

Based on the constraining conditions set in step S1901, reset requests are arbitrated so that constantly powered units of a predetermined combination do not simultaneously perform reset operations. An example of the constraining conditions will be described below. The constraint conditions according to this embodiment allow exclusive control of the reset operations. FIGS. 5A and 5B show examples of information indicating the constraining conditions, and show constantly powered units which can be reset simultaneously for each of the constantly powered units 121 to 123.

FIG. 5A shows whether or not each combination of constantly powered units can be reset simultaneously. In FIG. 5A, "1" indicates that the combination of constantly powered units can be reset simultaneously, and "0" indicates that the combination of constantly powered units cannot be reset simultaneously. For example, the constantly powered unit 1 can be reset simultaneously with the constantly powered unit 2, but cannot be reset simultaneously with the constantly powered unit 3. In the example shown in FIG. 5A, one or less constantly powered unit can be reset simultaneously with each constantly powered unit.

FIG. 5B enumerates constantly powered units which cannot be reset simultaneously for each constantly powered unit. For example, as shown in FIG. 5B, when the constantly powered units 2 and 3 perform reset operations, the constantly powered unit 1 cannot start a reset operation. In this manner, the form of constraining conditions is not particularly limited.

By setting the constraining conditions, reset operations of respective circuit blocks (constantly powered units) can be controlled. Merits obtained when such constraining conditions are set will be described below. When the reset operation control units 1 163 to N 164 are distributed on a chip, reset operation timings may vary depending on a system or device. For example, when reset periods of respective circuit blocks are determined in advance like in power-ON reset operations, start/end timings of reset operations can be easily predicted. However, when there are variation factors depending on the system, for example, when software randomly requests reset operations, it is difficult to predict start timings of reset operations. Also, timings that allow reset operations may vary due to variation factors depending on the device, for example, sizes, shapes, positions, the number, voltages, and temperatures of circuit blocks or individual differences depending on processes. For this reason, the order of reset operations of the plurality of circuit blocks may be different from the expected order.

Especially, like in circuits which execute image processing, when a plurality of circuit blocks have dependencies, reset operations may be required to be performed according to the dependencies so as to allow the system to operate normally. In this embodiment, by setting the constraining conditions, reset operations of circuit blocks can be exclusively controlled. More specifically, reset operations can be controlled so that circuit blocks A and B do not perform reset operations simultaneously.

In step S1902, the reset information holding unit 301 initializes held status information.

In steps S1903 to S1907, the priority setting unit 302 sets priorities for reset requests accepted from the reset generation unit 104, and enqueues them (queuing). More specifically, the priority setting unit 302 determines in step S1903 whether or not a new reset request is input from the reset generation unit 104 to the reset information holding unit 301. If a new reset request is input, the process advances to step S1904. If a new reset request is not input, the process jumps to step S1908.

In step S1904, the priority setting unit 302 updates status information to record the new reset request. In this embodiment, the status information held by the reset information holding unit 301 is updated to change "reset request" for the constantly powered unit corresponding to the reset request to "1".

The priority setting unit 302 determines in step S1905 with reference to the status information held by the reset information holding unit 301 whether or not a plurality of new reset requests are input. If a plurality of new reset requests are input, the process advances to step S1906. If one new reset request is input, the process jumps to step S1907.

In step S1906, the priority setting unit 302 decides priorities of the new reset requests according to the order information acquired from the constraining condition setting unit 305.

In step S1907, the priority setting unit 302 enqueues the new reset request or requests. More specifically, the priority setting unit 302 can store the new reset request or requests in a storage unit (not shown). If two or more new reset requests are to be enqueued, the priority setting unit 302 enqueues the new reset requests according to the priorities decided in step S1906. For the reset request or requests enqueued in this way, determination processing in step S1911 (to be described later) is sequentially executed.

The priority setting unit 302 determines in step S1908 whether or not a reset end notification indicating that a reset operation has ended in each constantly powered unit is input from each of the reset operation control units 1 163 to N 164 to the reset information holding unit 301. If the reset end notification is input, the process advances to step S1909. If no reset end notification is input, the process advances to step S1910. In this embodiment, assume that the reset operation control units 1 163 to N 164 control reset periods of the corresponding constantly powered units 1 121 to N 122 by counting the number of clocks. For this reason, the reset operation control units 1 163 to N 164 recognize reset operation end timings of the constantly powered units 1 121 to N 122. Note that the method of detecting reset operation end timings of the constantly powered units 1 121 to N 122 by the reset operation control units 1 163 to N 164 is not limited to this method.

In step S1909, the priority setting unit 302 updates the status information to record the reset end notification. In this embodiment, the status information held by the reset information holding unit 301 is updated to change "reset status" for the constantly powered unit, which has ended the reset operation, to "0".

In steps S1910 and S1911 and steps S1917 and S1918, the reset operation determination unit 303 determines whether or not the constantly powered unit is controlled to perform a reset operation. More specifically, in step S1910, the reset information determination unit 303 selects the constantly powered unit corresponding to one of reset requests queued in step S1907. In this embodiment, the reset information determination unit 303 selects the first reset request in the queue.

The reset information determination unit 303 determines in step S1911 according to the constraining conditions acquired from the constraining condition setting unit 305 whether or not the constantly powered unit selected in step S1910 is controlled to perform a reset operation. If the selected constantly powered unit is controlled to perform a reset operation, the process advances to step S1912; otherwise, the process advances to step S1917.

In step S1912, the reset operation instruction unit 304 transmits, to the reset generation unit 104, a signal which instructs the constantly powered unit selected in step S1910 to perform a reset operation. In step S1913, the reset generation unit 104 transmits a signal which instructs to start a reset operation to the reset operation control units 1 163 to N 164 in accordance with the signal received from the reset operation instruction unit 304 in step S1912. The reset operation control units 1 163 to N 164 to which the signal is transmitted are those corresponding to the instructed constantly powered units 1 121 to N 122. The reset operation control units 1 163 to N 164 which received the instruction control the corresponding constantly powered units 1 121 to N 122 to start a reset operation, and transmit a signal indicating that the reset operation is started to the reset information holding unit 301. In synchronism with the reset operation start timing, clocks begin to be supplied to the constantly powered units 1 121 to N 122.

The reset operation instruction unit 304 determines in step S1914 whether or not the signal indicating that the reset operation is started is input from the reset operation control units 1 163 to N 164 to the reset information holding unit 301. If the signal is input, the process advances to step S1915. If no signal is input, the process of step S1914 is repeated.

In step S1915, the reset operation instruction unit 304 updates the status information to record that the constantly powered unit selected in step S1910 has started the reset operation. In this embodiment, the status information held by the reset information holding unit 301 is updated to change "reset status" of the constantly powered unit, which has started the reset operation, to "1". Also, the reset operation instruction unit 304 updates the status information to record that the reset request of the constantly powered unit selected in step S1910 has been processed. In this embodiment, the status information held by the reset information holding unit 301 is updated to change "reset request" and "unprocessed reset request" for the constantly powered unit, which has started the reset operation, to "0". Furthermore, the reset operation instruction unit 304 deletes the reset request corresponding to the constantly powered unit selected in step S1910 from the queue which stores reset requests.

In step S1917, the reset information determination unit 303 updates the status information to record that a reset operation of the constantly powered unit selected in step S1910 is delayed. In this embodiment, the status information held by the reset information holding unit 301 is updated to change "unprocessed reset request" for the constantly powered unit selected in step S1910 to "1" and "reset request" to "0". When "unprocessed reset request" for the constantly powered unit selected in step S1910 already assumes "1", this record is maintained.

The reset information determination unit 303 determines in step S1918 whether or not a reset request next to that for the constantly powered unit selected in step S1910 is stored in the queue which stores reset requests. If the next reset request is stored, the process returns to step S1910, and the reset information determination unit 303 selects a reset request next to that for the previously selected constantly powered unit. In this manner, the reset information determination unit 303 sequentially selects reset requests in an order they are enqueued (for example, in an order requests are stored in a storage unit). If no next reset request is stored, the process returns to step S1903. After that, as for the constantly powered unit, the reset operation of which is delayed, whether or not to perform a reset operation is repetitively determined until it is determined in step S1911 that a reset operation is to be performed.

An operation example of the reset arbitration unit 105 will be described below with reference to FIGS. 4B to 4E and FIG. 7. In the following description, assume that the reset arbitration unit 105 operates according to the constraining conditions shown in FIG. 5B. After steps S1901 and S1902, the reset generation unit 104 issues a reset operation request of the constantly powered unit 1. In this case, the process advances from step S1903 to step S1904, and the priority setting unit 302 updates the status information to change "reset request" for the constantly powered unit 1 to "1". FIG. 4B shows an example of the updated status information. In this case, since the number of new reset requests confirmed in step S1903 is one, the process jumps from step S1905 to step S1907, and the reset request for the constantly powered unit 1 is stored in the queue. Assume that no reset end notification is input in step S1908, and the process advances to step S1910.

In step S1910, since only the reset request for the constantly powered unit 1 is stored in the queue, the reset information determination unit 303 selects the constantly powered unit 1. Even when the constantly powered unit 1 starts a reset operation, the constraining conditions are not violated, the reset information determination unit 303 decides in step S1911 that the constantly powered unit 1 is controlled to start a reset operation. Then, in step S1912, the reset operation instruction unit 304 transmits the signal which instructs the constantly powered unit 1 to perform a reset operation to the reset generation unit 104. In step S1913, the reset generation unit 104 transmits the signal which instructs to start a reset operation to the reset operation control unit 1 corresponding to the constantly powered unit 1. Then, at a timing $t_{i1}$, the constantly powered unit 1 starts a reset operation. Then, the reset operation instruction unit 304 confirms in step S1914 that a signal indicating that the reset operation is started is received. Furthermore, the in step S1915, the reset operation instruction unit 304 updates the status information so that "reset status" for the constantly powered unit 1 is changed to "1", and "reset request" is changed to "0".

After that, assume that the reset generation unit 104 issues a reset operation request of the constantly powered unit 2. In this case, the processes of steps S1903 and S1904 are executed, and the status information is updated to change "reset request" for the constantly powered unit 2 to "1". FIG. 4C shows an example of the status information at that time.

Then, the processes of steps S1905 to S1911 are sequentially executed. Even when the constantly powered units 1 and 2 simultaneously perform reset operations, the constraining conditions are not violated, and the reset information determination unit 303 decides in step S1911 that the constantly powered unit 2 is controlled to start a reset operation. By further executing steps S1912 to S1914, the constantly powered unit 2 starts a reset operation at a timing $t_{j1}$. Furthermore, in step S1915, the reset operation instruction unit 304 updates the status information to change "reset status" for the constantly powered unit 2 to "1", and "reset request" to "0".

After that, assume that the reset generation unit 104 issues a reset operation request of the constantly powered unit 3. In this case, the processes of steps S1903 and S1904 are executed, and the status information is updated to change "reset request" for the constantly powered unit 3 to "1". FIG. 4D shows an example of the status information at this time.

Then, the processes of steps S1905 to S1911 are sequentially executed. In this case, when the constantly powered unit 3 performs a reset operation simultaneously with the constantly powered units 1 and 2, the constraining conditions are violated, and the reset information determination unit 303 decides in step S1911 that the constantly powered unit 3 is not controlled to start a reset operation. The timing at this time is given as $t_{k1}$. In this case, in step S1917, the status information is updated to change "unprocessed reset request" for the constantly powered unit 3 to "1" and "reset request" to "0". Then, the process returns from step S1918 to step S1903.

After that, assume that the reset operation of the constantly powered unit 1 ends at a timing $t_{i2}$, and a reset end notification is input to the reset information holding unit 301. In this case, the processes of steps S1903, S1908, and S1909 are executed, and the status information is updated to change "reset status" for the constantly powered unit 1 to "0". FIG. 4E shows an example of the status information at that time. At this time, "reset status" and "clock status" of the constantly powered unit 2 remain to be "1", and "unprocessed reset request" of the constantly powered unit 3 remains to be "1".

In step S1910, the constantly powered unit 3, which corresponds to the previously queued reset request, is selected. The reset operation of the constantly powered unit 3 is not started at a timing $t_{k1}$, and the start of the reset operation is delayed. Then, the reset information determination unit 303 determines in step S1911 whether or not the constantly powered unit 3 is controlled to perform a reset operation. Note that the constraining conditions shown in FIG. 5B specify that the constantly powered unit 3 cannot start a reset operation only when the constantly powered units 1 and 2 simultaneously perform reset operations. Therefore, in this case, the reset information determination unit 303 decides that the constantly powered unit 3 is controlled to perform a reset operation. Then, by executing steps S1912 to S1914, the constantly powered unit 3 starts a reset operation at a timing $t_{k3}$. Furthermore, in step S1915, the reset operation instruction unit 304 updates the status information to change "reset status" for the constantly powered unit 3 to "1" and "unprocessed reset request" to "0".

After that, by repeating the same processes, the reset operation of the constantly powered unit 3 ends at a timing $t_{k4}$, and the status information is updated to change "reset status" for the constantly powered unit 3 to "0". At this time, "reset status" and "clock status" for the constantly powered unit 2 remain to be "1". Furthermore, the reset operation of the constantly powered unit 2 ends at a timing $t_{j2}$, and the status information is updated to change "reset status" for the constantly powered unit 2 to "0".

An example of the reset priority decision method in step S1906 will be described below with reference to FIG. 4A. A case will be described wherein IDs set for the constantly powered units are used as the order information, and constantly powered units having smaller IDs are reset with priority. For the sake of descriptive convenience, assume that ID1, ID2, ID3, and ID4 are respectively set for constantly powered units A, B, C, and D. The status information shown in FIG. 4A represents that a reset operation of the constantly powered unit B is underway, and reset requests for the constantly powered units A and D are input. In this way, since reset requests are simultaneously input for the constantly powered units A and D, reset priorities are decided according to the predetermined order information. In this case, a reset operation of the constantly powered unit A having a smaller ID is performed earlier. More specifically, "reset request" for the constantly powered unit A is changed to "0", and "reset status" is changed to "1". Also, a reset operation of the constantly powered unit D is delayed. That is, "reset request" for the constantly powered unit D is changed to "0", and "unprocessed reset request" is changed to "1".

Graphs 6a to 6c in FIG. 6 show examples of current values to be supplied when the constantly powered units 1 to 3 independently perform reset operations without using the method according to this embodiment. Also, a graph 6d in FIG. 6 shows a total of current values supplied to the constantly powered units 1 to 3. The total of current values shown in the graph 6d in FIG. 6 corresponds to currents observed at an observation site of a maximum current in the logic core region 202 when a current rise at this site is a total of current rises of the respective constantly powered units.

As shown in the graph 6a in FIG. 6, when the constantly powered unit 1 independently performs a reset operation, it is set in a reset status and a current $I_i$ flows during a period between timings $t_{i1}$ and $t_{i2}$. Likewise, as shown in the graph 6b in FIG. 6, when the constantly powered unit 2 independently performs a reset operation, it is set in a reset status and a current $I_j$ flows during a period between timings $t_{j1}$ and $t_{j2}$. Also, as shown in 6c of FIG. 6, when the constantly powered unit 3 independently performs a reset operation, it is set in a reset status and a current $I_k$ flows during a period between timings $t_{k1}$ and $t_{k2}$. In the example of FIG. 6, the constantly powered units are independently set in a reset status during a period between the timings $t_{i1}$ to $t_{j2}$. For this reason, the reset operations of the constantly powered units 1 to 3 may be simultaneously performed like in a period between the timings $t_{k1}$ to $t_{j2}$. In this case, a maximum current in the logic core region 202 reaches ($I_i+I_j+I_k$) and exceeds a maximum current allowable value Imax.

On the other hand, graphs 7a to 7c in FIG. 7 show current values when reset operations of the constantly powered units 1 to 3 are arbitrated according to this embodiment. Also, a graph 7d in FIG. 7 shows a total of current values supplied to the constantly powered units 1 to 3. In this example, the constraining conditions are generated so that reset operations cannot be simultaneously performed for a combination of circuit blocks in which current values supplied to the integrated circuit exceed a limit value when these circuit blocks simultaneously perform reset operations. Although the graphs 7a and 7b in FIG. 7 are the same as the graphs 6a and 6b in FIG. 6, a reset operation of the constantly powered unit 3 is delayed, as shown in the graph 7c in FIG. 7. For this reason, a maximum current in the logic core region 202 can be controlled to fall below the maximum current allowable value Imax.

As described above, according to the first embodiment, the reset arbitration unit 105 determines with reference to the information indicating operation status of each constantly powered unit and the constraining conditions whether or not reset operation is to be performed. Using the appropriate constraining conditions, reset operation timings can be controlled to supply proper electric powers. In the example of FIG. 7, the constraining conditions are generated so as to prevent current values supplied to the integrated circuit from exceeding the limit value. However, the constraining conditions are not limited to such specific conditions. For example, the constraining conditions may be generated so as to prevent a drop of a voltage to be supplied to each circuit block from exceeding a limit value when reset operations are simultaneously performed. Alternatively, the constraining conditions may be generated so as to prevent a power value to be supplied to the integrated circuit from exceeding a limit value.

Second Embodiment

Figure 10:
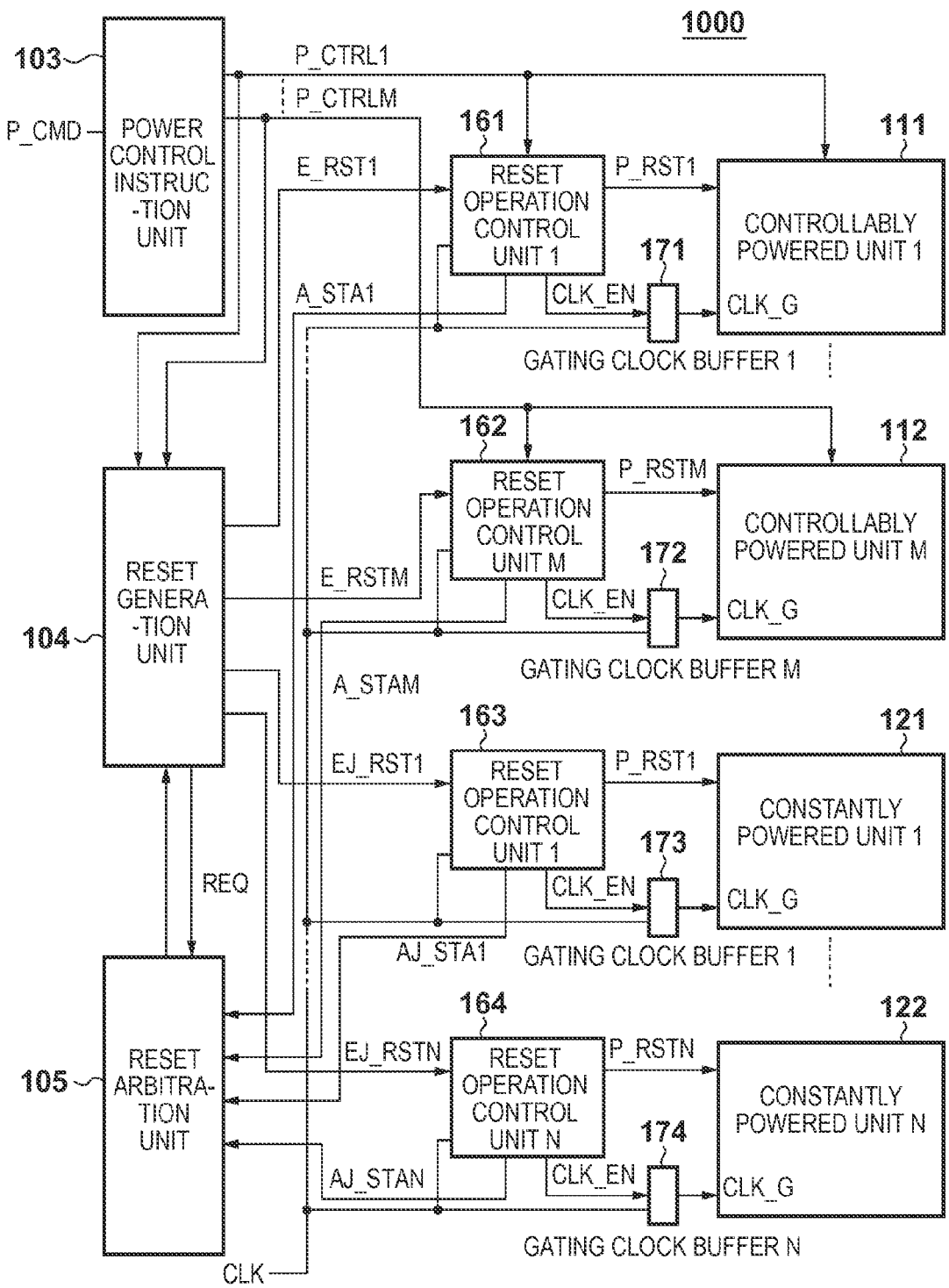
FIG. 10 is a block diagram showing an example of a semiconductor integrated circuit according to the second embodiment.

A semiconductor integrated circuit according to the second embodiment will be described below. FIG. 10 partially shows the arrangement of a semiconductor integrated circuit 1000 according to this embodiment. The semiconductor integrated circuit 1000 includes a plurality of circuit blocks and a reset circuit. In this embodiment, the semiconductor integrated circuit 1000 includes, as circuit blocks, a constantly powered unit 1 121, constantly powered unit N 122, and constantly powered units 2 to N−1 (not shown). Furthermore, in this embodiment, the semiconductor integrated circuit 1000 further includes, as circuit blocks, a controllably powered unit 1 111, controllably powered unit M 112, and controllably powered units 2 to M−1 (not shown). The constantly powered units 1 121 to N 122 are respectively portions of the semiconductor integrated circuit, and are those (circuit blocks) which are constantly powered as in the first embodiment. Also, the controllably powered units 1 111 to M 112 are portions (circuit blocks), power supply voltages of which are controllable. Note that N and M are integers, and N+M is not less than 2. Of course, each circuit block may include at least one controllably powered unit.

The reset circuit includes a reset generation unit 104 and reset arbitration unit 105 as in the first embodiment. Also, the reset circuit includes reset operation control units 1 163 to N 164 and gating clock buffers 1 173 to N 174 for the constantly powered units as in the first embodiment. Furthermore, the reset circuit includes reset operation control units 1 161 to M 162 and gating clock buffers 1 171 to N 172 for the controllably powered units.

A power control instruction unit 103 executes power control by transmitting a power control signal P_CTRL to the respective controllably powered units upon reception of a power control instruction P_CMD. For example, the power control instruction unit 103 transmits a signal P_CTRL1 to the controllably powered unit 1 111 and a signal P_CTRLM to the controllably powered unit M 112.

The reset arbitration unit 105 acquires operation information AJ_STA of the constantly powered units 1 121 to N 122 as in the first embodiment. Furthermore, the reset arbitration unit 105 acquires operation information A_STA of the controllably powered units 1 111 to M 112 from the reset operation control units 1 161 to M 162. Furthermore, the reset arbitration unit 105 arbitrates reset signals to be transmitted to the constantly powered units 1 121 to N 122 and controllably powered units 1 111 to M 112 according to a REQ signal from the reset generation unit 104.

The reset generation unit 104 is connected to the reset arbitration unit 105, reset operation control units 1 163 to N 164, and reset operation control units 1 161 to M 162 to be able to communicate with each other. The reset generation unit 104 can transmit signals EJ_RST to the reset operation control units 1 163 to N 164 as in the first embodiment. Also, reset generation unit 104 can transmit signals E_RST to the reset operation control units 1 161 to M 162, so as to instruct the controllably powered units 1 111 to M 112 to perform reset operations. Furthermore, to the reset generation unit 104, the power control signals P_CTRL from the power control instruction unit 103 are input. Reset requests are arbitrated based on the power control signals P_CTRL which can serve as power control information indicating power control statuses. For example, based on the power control signal P_CTRL, the reset generation unit 104 generates reset requests at the beginning of supply of power supply voltages, and the reset requests can be arbitrated by the reset arbitration unit 105.

The reset operation control units 1 161 to M 162 for the controllably powered units transmit reset signals P_RST1 to P_RSTM to the corresponding controllably powered units 1 111 to M 112. The controllably powered units 1 111 to M 112 perform reset operations at timings controlled by the reset generation unit 104 and reset arbitration unit 105 according to the reset signals. The reset operation control units 1 161 to M 162 transmit clock enable signals CLK_EN to the gating clock buffers 1 171 to M 172. The reset operation control units 1 163 to N 164 for the constantly powered units are the same as those in the first embodiment.

The detailed arrangement of the controllably powered unit 1 111 will be described below with reference to FIG. 13A. The controllably powered units 2 to M have the same arrangement as that of the controllably powered unit 1. The controllably powered unit 1 111 includes a switch 1301, power supply network 1302, and circuit block 1303. A power source Vdda is connected to the circuit block 1303 via the switch 1301 and power supply network 1302. This switch 1301 controls to supply and shut off a power supply voltage. In the example of FIG. 13A, a power switch configured by a PMOS is used as the switch 1301. However, the switch 1301 is not particularly limited as long as it is a component used to control a power supply voltage in the semiconductor integrated circuit, and a power control method is not limited.

Figure 2B:
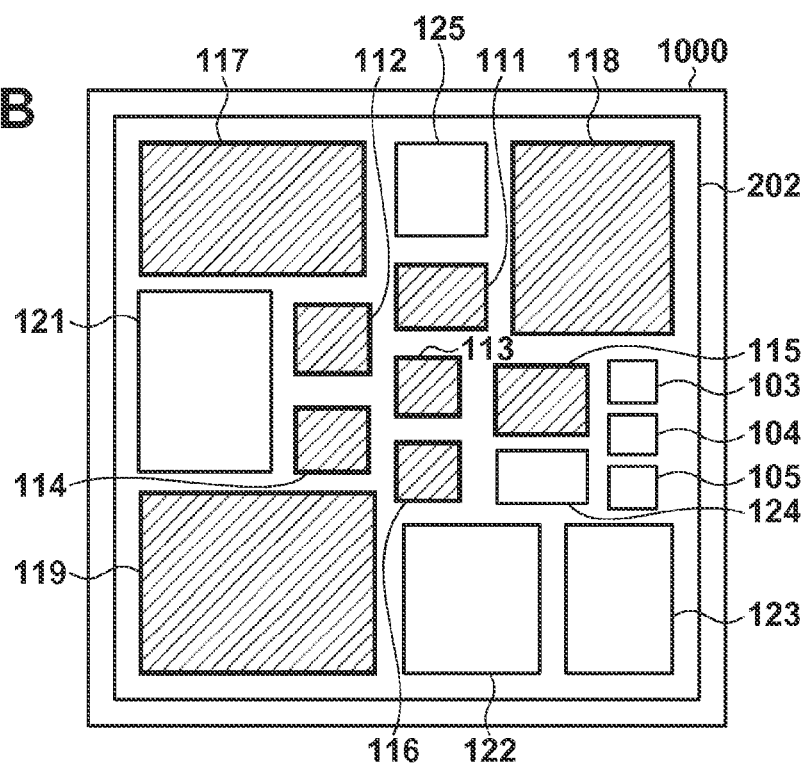

FIG. 2B shows a schematic floor plan example of the semiconductor integrated circuit 1000 according to this embodiment. In a logic core region 202 of the semiconductor integrated circuit 1000, a plurality of constantly powered units 121 to 125 and a plurality of controllably powered units 111 to 119 are allocated. Also, the power control instruction unit 103, reset generation unit 104, and reset arbitration unit 105 are allocated, and belong to constantly powered units. FIG. 2B shows that the four controllably powered units 111, 112, 113, and 114 are densely allocated (hatched portions).

FIG. 11 shows an internal arrangement example of the reset arbitration unit 105 according to this embodiment. The arrangement of the reset arbitration unit 105 according to this embodiment is the same as that of the first embodiment, and a reset information holding unit 301 further receives pieces of information 1101 and 1102 about the controllably powered units 1 to M. The reset information holding unit 301, a priority setting unit 302, a reset information determination unit 303, a reset operation instruction unit 304, and a constraining condition setting unit 305 operate in the same manner as in the first embodiment unless otherwise specified.

FIGS. 5C and 5D show examples of constraining conditions used in this embodiment. FIG. 5C is the same as FIG. 5A, and FIG. 5D is the same as FIG. 5B. For example, in FIG. 5D, a controllably powered unit 5 does not start a reset operation in any of the following cases (i) to (iii). That is, (i) reset operations of all of controllably powered units 1, 3, and 6 are underway, (ii) reset operations of both controllably powered units 8 and 1 are underway, or (iii) reset operations of both controllably powered units 8 and 3 are underway. FIGS. 5C and 5D do not show any constraining conditions for the constantly powered units for the sake of simplicity. However, the constraining conditions can include combinations of constantly powered units which do not perform reset operations simultaneously, and combinations of controllably powered units and constantly powered units which do not perform reset operations simultaneously.

The reset arbitration unit 105 according to this embodiment operates according to FIGS. 19A and 19B as in the first embodiment. The operation of the reset arbitration unit 105 will be described below with reference to FIGS. 4F to 4H and FIG. 9. In the following description, assume that the reset arbitration unit 105 operates according to the constraining conditions shown in FIG. 5D.

The reset arbitration unit 105 sequentially receives reset requests for controllably powered units 1, 2, and 3. For example, upon reception of the reset request of the controllably powered unit 1, "reset request" of the controllably powered unit 1 is updated to "1" in step S1904. Also, in step S1915, "reset request" of the controllably powered unit 1 is updated to "0", and "reset status" is updated to "1". In this manner, "reset status" of the controllably powered unit 1 is updated to "1" at a timing $t_{a1}$. Likewise, "reset statuses" of the controllably powered units 2 and 3 are updated to "1" at timings $t_{b1}$, and $t_{c1}$. Subsequently, the reset arbitration unit 105 receives a reset request of a controllably powered unit 4, and "reset request" of the controllably powered unit 4 is updated to "1" in step S1904. FIG. 4F shows an example of the status information at that time.

Subsequently, in step S1910, the controllably powered unit 4 as a reset request target is selected. In this case, as shown in FIG. 5D, when the controllably powered units 1, 2, and 3 perform reset operations simultaneously, the controllably powered unit 4 does not start a reset operation. Therefore, the process advances from step S1911 to step S1917 to update "reset request of the controllably powered unit 4 to "0" and "unprocessed reset request" to "1". In this way, the start of a reset operation of the controllably powered unit 4 is delayed.

After that, the reset operation of the controllably powered unit 1 ends at a timing $t_{a2}$. Then, the reset arbitration unit 105 receives a reset end notification from a reset operation control unit 1. After that, in step S1909, "reset status" of the controllably powered unit 1 is updated from "1" to "0". FIG. 4G shows an example of the status information at that time. In this case, "clock statuses" and "reset statuses" of the controllably powered units 2 and 3 remain to be "1". Also, the reset request of the controllably powered unit 4 remains queued.

Subsequently, in step S1910, the controllably powered unit 4, the reset request of which is queued, is selected. In this case, as shown in FIG. 5D, when the controllably powered units 2 and 3 perform reset operations simultaneously, the controllably powered unit 4 does not start a reset operation. Therefore, the start of a reset operation of the controllably powered unit 4 is delayed.

After that, the reset operation of the controllably powered unit 3 ends at a timing $t_{c2}$. Then, the reset arbitration unit 105 receives a reset end notification from a reset operation control unit 3. After that, in step S1909, "reset status" of the controllably powered unit 3 is updated from "1" to "0". FIG. 4H shows an example of the status information at that time.

Subsequently, in step S1910, the controllably powered unit 4, the reset request of which is queued, is selected. In this case, as shown in FIG. 5D, even when the controllably powered unit 2 alone performs a reset operation, the controllably powered unit 4 can start a reset operation. Therefore, the process advances from step S1911 to step S1913 via step S1912, and a reset operation of the controllably powered unit 4 is started at a timing $t_{d3}$. After that, the reset operation of the controllably powered unit 2 ends at a timing $t_{b2}$, and that of the controllably powered unit 4 ends at a timing $t_{d4}$.

FIG. 12 is a timing chart showing the operation timings of the arrangement according to this embodiment shown in FIG. 10. In a state in which an external clock signal CLK is constantly supplied, a power shutoff period T1 transitions to a power returning period T2 in response to a power control instruction P_CMD. During the power returning period T2, a power supply by the power source Vdda is started. When the power supply preparation of the power source Vdda nearly ends, that is, the power supply is nearly stabilized, a signal A_STA1 from the controllably powered unit 1 and a signal A_STAM from the controllably powered unit M are transmitted to the reset arbitration unit 105. After the power supply is stabilized, the controllably powered unit 1 transitions to a steadily operating period T4 via a reset period T3.

More specifically, upon reception of a power control instruction P_CMD, the reset generation unit 104 generates reset requests of the controllably powered units 1 and M, and transmits them to the reset arbitration unit 105. The reset arbitration unit 105 acquires information from the controllably powered units 1 and M, arbitrates the transmitted reset requests, and transmits an arbitration result to the reset generation unit 104. Then, the reset generation unit transmits a signal E_RST to a reset operation control unit corresponding to the controllably powered unit which is to perform a reset operation. In this case, assume that the reset arbitration unit 105 decides as a result of arbitration that the controllably powered unit 1 is to perform a reset operation and a reset operation of the controllably powered unit M is delayed. In this case, a signal E_RST1 is activated. Then, in response to the signal E_RST1, the reset operation control unit 161 activates a signal CLK_EN. In response to this signal CLK_EN, the gating clock buffer 171 transmits clocks CLK_G to the controllably powered unit 1. Furthermore, the reset operation control unit 161 deactivates the signal P_RST1 at the adjusted timing, and the reset generation unit 104 deactivates the signal E_RST1.

When the reset operation of the controllably powered unit 1 ends in this way, the reset arbitration unit 105 instructs the reset generation unit 104 to start a reset operation of the controllably powered unit M. More specifically, during a reset period T5, which does not overlap the reset period T3, the reset generation unit 104 activates a signal E_RSTM. Then, the controllably powered unit M performs a reset operation in the same manner as in the controllably powered unit 1, and then transitions to a steadily operating period T6.

In the above example, the power returning operation is executed according to the input power control instruction P_CMD. However, when the respective controllably powered units have already been powered, signals E_RST, which instruct to perform reset operations, are transmitted at timings decided by the reset generation unit 104.

Figure 8:
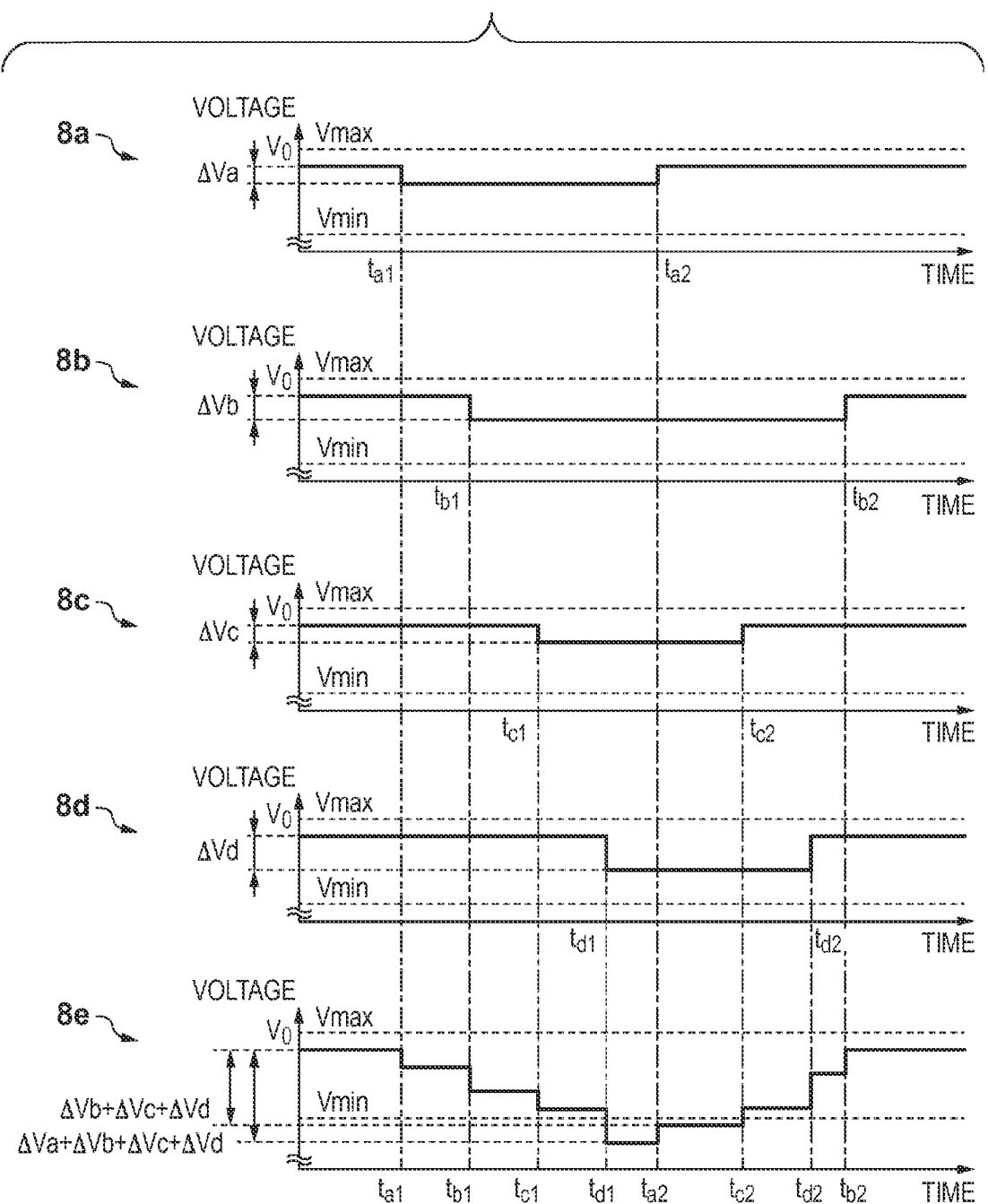
FIG. 8 shows graphs showing current values when a method of the second embodiment is not used.

Graphs 8a to 8d shown in FIG. 8 show examples of voltages to be supplied when the controllably powered units 1 to 4 independently perform reset operations. As shown in the graph 8a in FIG. 8, when the power supply of the controllably powered unit 1 111 is solely returned, the controllably powered unit 1 performs a reset operation during a period between timings $t_{a1}$ and $t_{a2}$, and a voltage drops by $\Delta Va$. Likewise, the graphs 8b to 8d in FIG. 8 show cases in which the power supplies of the controllably powered units 2, 3, and 4 are solely returned. More specifically, the controllably powered units 2, 3, and 4 perform reset operations respectively during periods between timings $t_{b1}$ and $t_{b2}$, between timings $t_{c1}$ and $t_{c2}$, and between timings $t_{d1}$ and $t_{d2}$, and voltages drop respectively by $\Delta Vb$, $\Delta Vc$, and $\Delta Vd$.

A graph 8e in FIG. 8 shows a voltage drop when the controllably powered units 1 to 4 perform reset operations at the timings shown in the graphs 8a to 8d in FIG. 8. This voltage drop is a total of voltage drops when the controllably powered units 1 to 4 independently perform reset operations. A voltage value shown in the graph 8e in FIG. 8 corresponds to a voltage observed at an observation site of a minimum voltage in the logic core region 202 when a voltage drop at this site is a total of voltage drops of the respective controllably powered units. As shown in FIG. 8, during a period between timings $t_{d1}$ and $t_{d2}$, reset operations of the controllably powered units 1 to 4 are performed. A voltage value during this period amounts to $(V_0 - \Delta Va - \Delta Vb - \Delta Vc - \Delta Vd)$, and falls below the minimum voltage Vmin.

Figure 9:
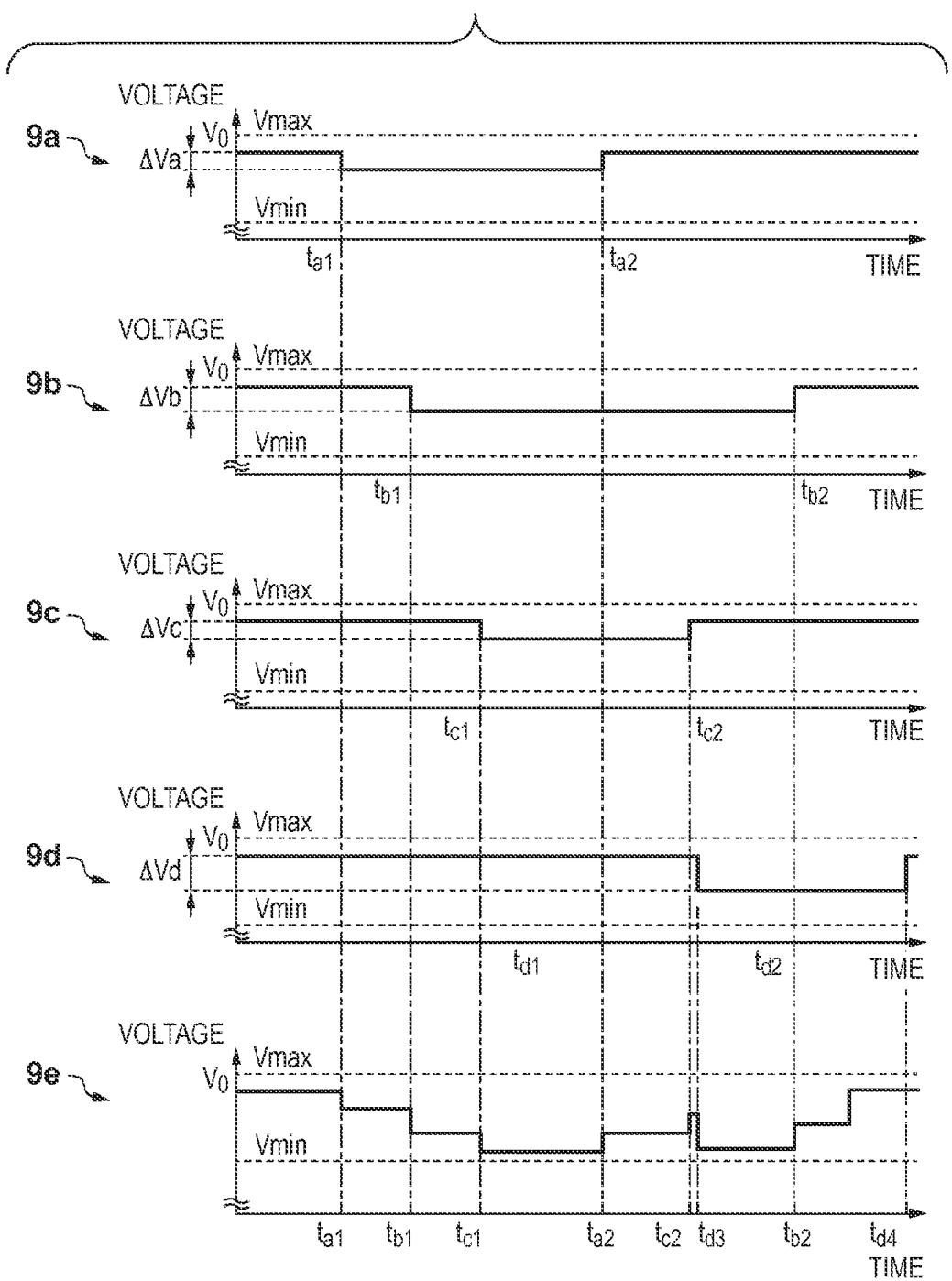
FIG. 9 shows graphs showing current values when the method of the second embodiment is used.

On the other hand, graphs 9a to 9d in FIG. 9 show examples of voltages to be supplied when the controllably powered units 1 to 4 independently perform reset operations as in 8a to 8d of FIG. 8. The graph 9e in FIG. 9 shows a voltage drop when the reset operations of the controllably powered units 1 to 4 are arbitrated. This voltage drop is also a total of voltage drops when the controllably powered units 1 to 4 independently perform reset operations. In this embodiment, for example, the constraining conditions are generated so that drops of voltages to be supplied to respective circuit blocks do not exceed a limit value when reset operations are performed simultaneously. As shown in a graph 9e in FIG. 9, according to the method of this embodiment, a voltage can be prevented from falling below the minimum voltage Vmin.

As described above, according to the second embodiment, reset operation timings can be controlled to supply a proper electric power. Since a power supply to each controllably powered unit is controlled, a reset operation is normally requested at a frequency higher than the constantly powered unit, and hence, reset requests are often generated at close timings. The method of this embodiment allows supply of a proper electric power even in such case.

In this embodiment, the controllably powered units are included in the logic core region 202, and power control of circuits such as an I/O located outside the logic core region can also be similarly executed.

Third Embodiment

Figure 15:
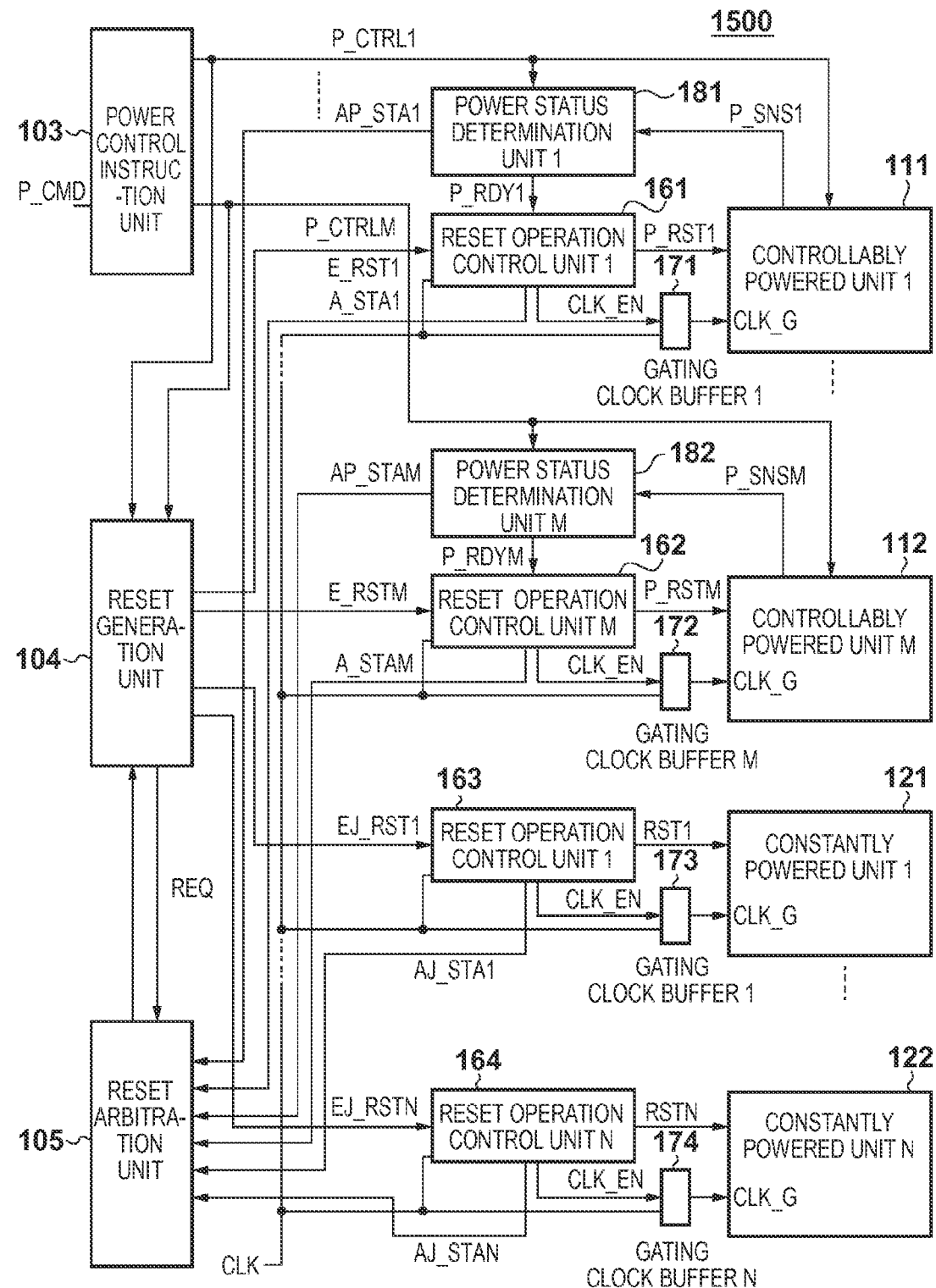
FIG. 15 is a block diagram showing an example of a semiconductor integrated circuit according to the third embodiment.

A semiconductor integrated circuit according to the third embodiment will be described below. FIG. 15 partially shows the arrangement of a semiconductor integrated circuit 1500 according to this embodiment. The semiconductor integrated circuit according to this embodiment is the same as that according to the second embodiment, except that power status determination units 1 181 to M 182 are added to a reset circuit. The power status determination units 1 181 to M 182 relate to controllably powered units 1 111 to M 112. The arrangements and operations of respective units included in the semiconductor integrated circuit according to this embodiment are the same as those of the units included in the semiconductor integrated circuit 1000 according to the second embodiment unless otherwise specified.

To the power status determination units 1 181 to M 182, detection terminals used to monitor power supply voltages of the corresponding controllably powered units are connected. For example, as shown in FIG. 13B, to the power status determination unit 1 181, a detection terminal P_SNS used to monitor a power supply voltage of a power supply network 1302 in the controllably powered unit 1 111 is connected. As described above, the power supply network 1302 supplies an electric power to a circuit block 1303. Also, to the power status determination units 1 181 to M 182, power control signals P_CTRL for the corresponding controllably powered units 1 111 to M 112 are input. Furthermore, the power status determination units 1 181 to M 182 transmit signals P_RDY indicating whether or not Vdda is ready to corresponding reset operation control units 1 161 to M 162. Furthermore, the power status determination units 1 181 to M 182 transmit power status information AP_STA used to arbitrate reset operations to a reset arbitration unit 105. The power status information AP_STA is also information indicating whether or not Vdda is ready.

In this embodiment, by monitoring a power supply voltage of each controllably powered unit using the detection terminal (voltage monitoring), whether or not Vdda is ready, that is, whether or not a voltage which allows a reset operation is supplied to the controllably powered unit is determined. Then, the reset arbitration unit 105 arbitrates reset requests so that a reset operation is started when a power supply voltage of the controllably powered unit is enough to perform a reset operation. However, in consideration of a time lag, when a power supply voltage exceeds a predetermined value lower than Vdda, it may be determined that a power supply voltage is enough to perform a reset operation. When the controllably powered units 111 to 112 have already been powered, the signals AP_STA indicating power statuses of the controllably powered units 111 to 112 may not be used. Then, reset operations of the controllably powered units 111 to 112 are controlled via signals E_RST from a reset generation unit 104.

In response to the signals P_RDY from the corresponding power status determination units 1 181 to M 182, the reset operation control units 1 161 to M 162 transmit pieces of information A_STA of the controllably powered units 1 111 to M 112 to the reset arbitration unit 105. This information includes that indicating a reset operation status of each of the controllably powered units 1 111 to M 112 and that indicating a clock supply status. Also, the reset operation control units 1 161 to M 162 receive signals E_RST from the reset generation unit 104. Then, the reset operation control units 1 161 to M 162 transmit reset signals P_RST to the corresponding controllably powered units 1 111 to M 112 at set timings. Furthermore, the reset operation control units 1 161 to M 162 transmit clock enable signals CLK_EN to gating clock buffers 1 171 to N 172.

The reset arbitration unit 105 receives the pieces of information A_STA of the controllably powered units 1 111 to M 112 from the reset operation control units 1 161 to M 162, as in the second embodiment. Furthermore, the reset arbitration unit 105 receives pieces of power status determination information AP_STA from the power status determination units 1 181 to M 182. Then, the reset arbitration unit 105 arbitrates reset signals using the pieces of input information, and transmits an instruction to the reset generation unit 104.

The reset generation unit 104 receives power control signals P_CTRL to the controllably powered units 1 111 to M 112 as in the second embodiment. Also, the reset generation unit 104 transmits reset signals E_RST to the reset operation control units 1 161 to M 162 for the controllably powered units according to the arbitration result of the reset arbitration unit 105. Furthermore, the reset generation unit 104 also transmits signals to reset operation control units 1 163 to N 164 for constantly powered units according to the arbitration result of the reset arbitration unit 105.

Each of the controllably powered units 1 111 to M 112 includes a switch 1301, power supply network 1302, and circuit block 1303, as exemplified in FIG. 13B. A power source Vdda is connected to the circuit block 1303 via the switch 1301 such as a power switch and the power supply network 1302.

Figure 16:
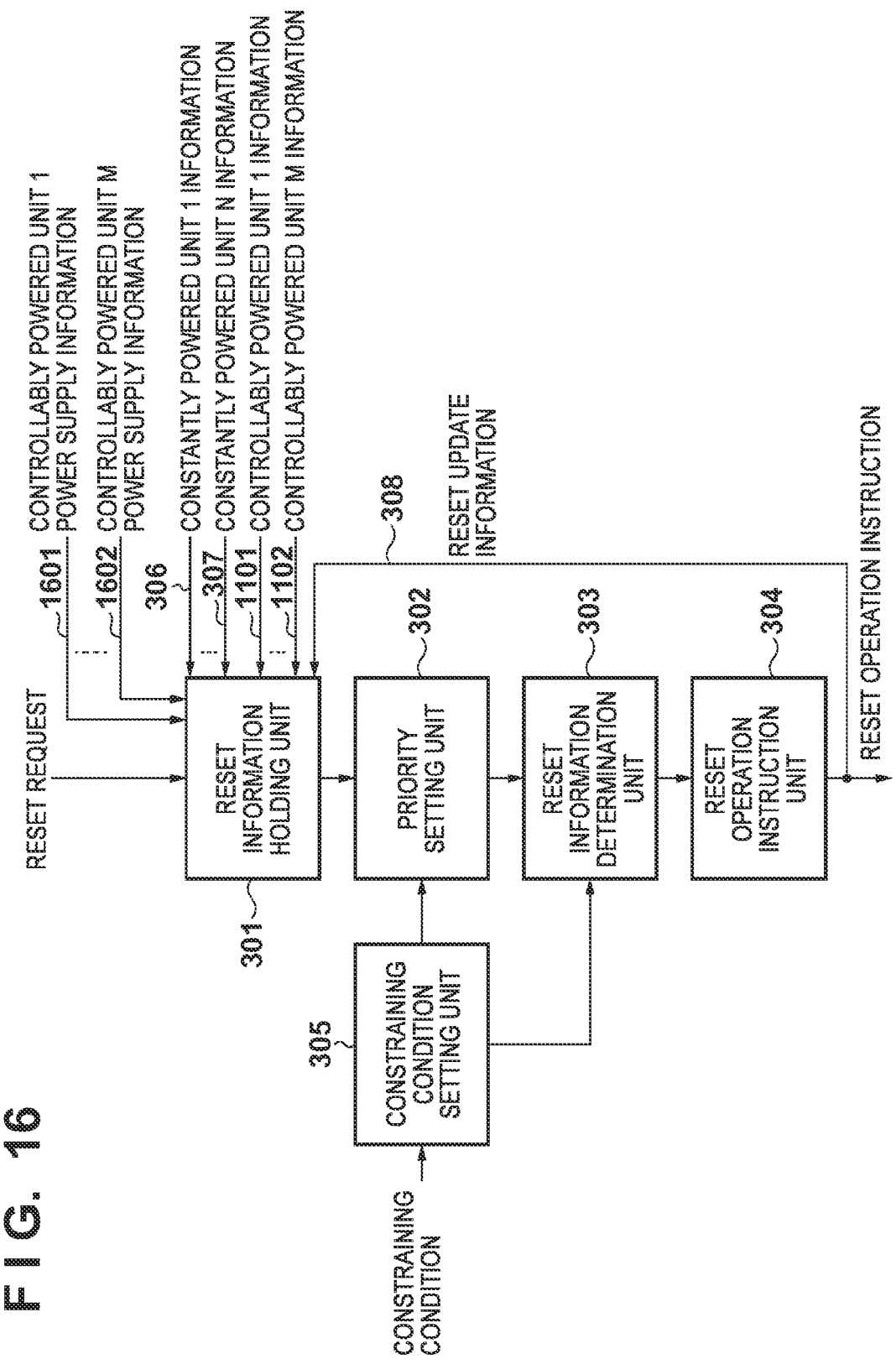
FIG. 16 is a block diagram showing an example of a reset arbitration unit 105 according to the third embodiment.

FIG. 16 shows an internal arrangement example of the reset arbitration unit 105 according to this embodiment. The arrangement of the reset arbitration unit 105 according to this embodiment is the same as that of the second embodiment, except that a reset information holding unit 301 further receives pieces of power status information AP_STA 1101 to 1102 about the controllably powered units 1 to M. The reset information holding unit 301, a priority setting unit 302, a reset information determination unit 303, a reset operation instruction unit 304, and a constraining condition setting unit 305 operate in the same manner as in the first embodiment unless otherwise specified.

The reset arbitration unit 105 according to this embodiment operates in the same manner as in the second embodiment according to FIGS. 19A and 19B, except for the process of step S1911. The reset information determination unit 303 determines in step S1911 with reference to constraining conditions whether or not a constantly powered unit or controllably powered unit selected in step S1910 is to perform a reset operation, as in the second embodiment. In this embodiment, when a controllably powered unit is selected in step S1910, the reset information determination unit 303 further refers to the power status information AP_STA of the selected controllably powered unit to determine whether or not to perform a reset operation. More specifically, according to the constraining conditions, when a reset operation can be performed, and a power supply voltage is enough, the reset information determination unit 303 decides that a reset operation is performed. On the other hand, when a power supply voltage is not enough, the reset information determination unit 303 delays a reset operation.

As another embodiment, the process of step S1911 is executed in the same manner as in the second embodiment, and when a signal indicating that a reset operation has been started is not input within a predetermined time period in step S1914, the process may advance to step S1915. Each of the reset operation control units 1 to M can be configured to start a reset operation when a power supply voltage is enough with reference to the signal P_RDY, and to input a signal indicating the start of the reset operation to the reset arbitration unit 105. For this reason, with this arrangement as well, start/delay of a reset operation can be decided according to a power supply voltage.

As described above, according to the third embodiment, reset requests are arbitrated using power statuses of the controllably powered units and the constraining conditions. When reset operations are controlled with reference to the power statuses, reset start timings can change due to process-dependent variations, temperature changes, and the like, which are hardly recognized in a design stage. According to the method of this embodiment, with reference to the constraining conditions, a proper electric power can be supplied even in this case. In this embodiment, reset requests are arbitrated with reference to the power statuses of the controllably powered units, but reset requests may be arbitrated with reference to power statuses of the constantly powered units.

Fourth Embodiment

A semiconductor integrated circuit according to the fourth embodiment will be described below. FIG. 17 partially shows the arrangement of a semiconductor integrated circuit 1700 according to this embodiment. In this embodiment, constraining conditions are automatically generated by acquiring current information of controllably powered units and constantly powered units at the time of reset.

The semiconductor integrated circuit 1700 is the same as the semiconductor integrated circuit 1500 according to the third embodiment, except that a current monitor unit 191 is added. In addition, a signal TR_MODE is input to the respective units of the semiconductor integrated circuit 1700. The signal TR_MODE is used to switch between a normal operation mode in which the same operation as in the third embodiment is performed and a training mode in which constraining conditions are automatically generated. The signal TR_MODE is input from a constituent element (not shown) in the semiconductor integrated circuit 1700 or from outside the semiconductor integrated circuit 1700. The operation of the training mode is executed in an initial stage before the start of the normal operation mode.

The signal TR_MODE, reset signals P_RST from reset operation control units 1 161 to M 162, and signals P_MONT from controllably powered units 1 111 to M 112 are input to the current monitor unit 191. In addition, reset signals P_RST from reset operation control units 1 163 to N 164 and signals MONT from constantly powered units 1 121 to N 122 are input to the current monitor unit 191. The signals P_MONT and MONT are used to cause the current monitor unit 191 to detect currents in the respective controllably powered units or constantly powered units. In this manner, the current monitor unit 191 can monitor the values of flowing currents for the controllably powered units 1 111 to M 112 and the constantly powered units 1 121 to N 122. A constraining condition generation unit 1801 (to be described later) generates constraining conditions using the monitoring result. In this embodiment, current values are monitored. However, the statuses of the controllably powered units 1 111 to M 112 and the constantly powered units 1 121 to N 122 may be monitored (circuit monitoring), and constraining conditions may be generated using the monitoring result. An example of the status to be monitored is a power status such as a voltage value or an electric power value.

FIG. 21 shows a structure example of the current monitor unit 191 according to this embodiment. The current monitor unit 191 includes a control unit 2103 and an input switching unit 2104. The input switching unit 2104 is a circuit configured to select a signal from the signals P_MONT and MONT used to detect currents. The current monitor unit 191 also includes an amplifier 2101 that amplifies the acquired signal, and an A/D conversion unit 2102 that converts an amplified analog signal into a digital signal. The obtained digital signal acts as current information indicating the magnitude of a current flowing to each controllably powered unit or constantly powered unit. The current monitor unit 191 further includes an information holding unit 2105 that holds the current information obtained by the A/D conversion unit 2102, and an information output unit 2106 that outputs the current information.

P_RST and RST that are reset signals to the controllably powered units and the constantly powered units are input to the control unit 2103. In the training mode, a reset generation unit 104 controls the signals P_RST and RST so that the controllably powered units and the constantly powered units sequentially serially perform reset operations. The control unit 2103 causes the input switching unit 2104 to switch the signal to be acquired based on the signals P_RST and RST. At a timing the controllably powered unit or constantly powered unit to perform a reset operation is switched, the input switching unit 2104 performs a switching operation so as to acquire the signal MONT or P_MONT for the controllably powered unit or constantly powered unit to perform a reset operation. The information holding unit 2105 holds current information obtained by the A/D conversion unit 2102 for each controllably powered unit or constantly powered unit under the control of the control unit 2103. When all pieces of current information for the controllably powered units and the constantly powered units are obtained, the information output unit 2106 transmits the obtained current information to a reset arbitration unit 105.

In FIG. 17, signals P_MONT1 to P_MONTM from the controllably powered units 1 111 to M 112 are sequentially input to the current monitor unit 191. Based on the input signals P_MONT1 to P_MONTM, the current monitor unit 191 sequentially generates signals P_MONT1_OUT to P_MONTM_OUT indicating current values in the controllably powered units 1 111 to M 112. Likewise, signals MONT1 to MONTN from the constantly powered units 1 121 to N 122 are sequentially input to the current monitor unit 191. The current monitor unit 191 sequentially generates signals MONT1_OUT to P_MONTN_OUT indicating current values in the constantly powered units 1 121 to N 122. The generated signals P_MONT_OUT and MONT_OUT are transmitted to the reset arbitration unit 105.

In this embodiment, one current monitor unit 191 is provided for a plurality of controllably powered units and constantly powered units. However, if it is found in advance based on the gate scales of circuit blocks or information such as a power supply voltage that current values can be parallelly measured, current values may be parallelly measured using a plurality of current monitor units.

FIG. 18 shows an internal arrangement example of the reset arbitration unit 105 according to this embodiment. The arrangement of the reset arbitration unit 105 according to this embodiment is the same as that of the third embodiment, except that it further includes the constraining condition generation unit 1801. A reset information holding unit 301, a priority setting unit 302, a reset information determination unit 303, a reset operation instruction unit 304, and a constraining condition setting unit 305 operate in the same manner as in the third embodiment unless otherwise specified.

To the constraining condition generation unit 1801, the signal TR_MODE and the above-described current information P_MONT_OUT and MONT_OUT are input. Then, the constraining condition generation unit 1801 generates constraining conditions using the input power constraining conditions, and power supply voltage information for the controllably powered units and the constantly powered units. The power constraining conditions indicate maximum limit values of electric powers to be supplied to the controllably powered units and the constantly powered units at the time of reset. The power constraining conditions can be input from a constituent element (not shown) in the semiconductor integrated circuit 1700 or from outside the semiconductor integrated circuit 1700, for example, set by the user. The constraining condition generation unit 1801 calculates power values from the current information and power supply voltage information for the controllably powered units and the constantly powered units. Based the calculated power values, the constraining condition generation unit 1801 generates constraining conditions so that electric powers to be supplied to the controllably powered units and the constantly powered units do not exceed a maximum limit value at the time of reset, and transmits them to the constraining condition setting unit 305.

A constraining condition generation method of the constraining condition generation unit 1801 will be described below with reference to the flowchart of FIG. 20. In this embodiment, processing shown in FIG. 20 is performed in step S1901. In step S2001, the constraining condition generation unit 1801 starts the training mode. More specifically, the constraining condition generation unit 1801 switches the signal TR_MODE to "active". In step S2002, the constraining condition generation unit 1801 acquires power constraining conditions.

In step S2003, the constraining condition generation unit 1801 controls the reset operation control units 161 to 164 to sequentially perform reset operations for the controllably powered units and the constantly powered units. Then, the current monitor unit 191 acquires current information of the controllably powered units and the constantly powered units. For example, when a mechanism configured to count clocks is provided in each reset operation control unit, reset operations can be started at different timings. Current information indicates a value of a current that flows when a controllably powered unit or a constantly powered unit solely performs a reset operation.

In step S2004, the constraining condition generation unit 1801 selects one of the controllably powered units and the constantly powered units. The selected controllably powered unit or constantly powered unit will be referred to as a target circuit block hereinafter. In subsequent steps S2005 to S2010, constraining conditions for the target circuit block are generated.

In step S2005, the constraining condition generation unit 1801 selects one or more circuit blocks out of the controllably powered units and the constantly powered units except the target circuit block. For example, one of the controllably powered units and the constantly powered units except the target circuit block is selected. In step S2006, the constraining condition generation unit 1801 calculates a total of a power value for the target circuit block and a power value for the circuit block selected in step S2005 or S2010. A power value for the target circuit block indicates a power value consumed when the target circuit block solely performs a reset operation. A power value for the circuit block selected in step S2005 or S2010 indicates a total of power values consumed when respective selected circuit blocks solely perform reset operations. As described above, the value of a power flowing when a controllably powered unit or a constantly powered unit solely performs a reset operation can be calculated using power supply voltage information and current information.

In step S2007, the constraining condition generation unit 1801 determines whether or not the total power calculated in step S2006 meets the power constraining conditions, for example, whether or not the total power is equal to or less than a maximum limit value. If the power constraining conditions are met, the process advances to step S2008. If the power constraining conditions are not met, the process advances to step S2009. In step S2008, the constraining condition generation unit 1801 records information that identifies one or more circuit blocks selected in step S2005 or S2010 as one of constraining conditions for the target circuit block. According to this information, when one or more circuit blocks selected in step S2005 or S2010 perform reset operations simultaneously, it is specified that the reset operation of the target circuit block cannot start. According to this method, the constraining conditions can be generated so that reset operations cannot be simultaneously performed for a combination of circuit blocks in which a total of current consumption values exceeds a predetermined limit value.

In step S2009, the constraining condition generation unit 1801 determines whether or not different circuit blocks can be selected in step S2010. If different circuit blocks can be selected, the process advances to step S2010 to newly select one or more circuit blocks out of the controllably powered units and the constantly powered units except the target circuit block. In steps S2005 and S2010, the constraining condition generation unit 1801 can sequentially select a combination of one or more circuit blocks out of the controllably powered units and the constantly powered units except the target circuit block. For example, the constraining condition generation unit 1801 can sequentially select a combination from all combinations of one or more circuit blocks out of the controllably powered units and the constantly powered units except the target circuit block. In this case, when no unselected combinations remain, the constraining condition generation unit 1801 determines that different circuit blocks cannot be selected in step S2010. Note that the method of selecting a combination of one or more circuit blocks out of the controllably powered units and the constantly powered units is not particularly limited. For example, adding or excluding one of the controllably powered units and the constantly powered units to or from a combination may be repeated.

Upon determining that different circuit blocks cannot be selected in step S2010, the process advances to step S2012. In step S2012, the constraining condition generation unit 1801 determines whether or not a controllably powered unit or constantly powered unit which is not selected as a target circuit block yet exists. If such unit exists, the process advances to step S2011, and the constraining condition generation unit 1801 selects one of the controllably powered units or constantly powered units which are not selected as a target circuit block yet. If such unit does not exist, the process advances to step S2013. In step S2013, the constraining condition generation unit 1801 transmits the obtained constraining conditions to the constraining condition setting unit 305. In step S2014, the constraining condition generation unit 1801 ends the training mode, and starts the normal mode. More specifically, the constraining condition generation unit 1801 changes the signal TR_MODE to "inactive". Then, processing from step S1902 is performed.

The above processing shown in FIG. 20 need not always be performed. For example, the constraining condition generation unit 1801 may transmit constraining conditions generated previously to the constraining condition setting unit 305 in step S1901. More specifically, when a predetermined time has elapsed from previous constraining condition generation timing, or when an instruction such as a user instruction from outside the constraining condition generation unit 1801 is received, the constraining condition generation unit 1801 may generate constraining conditions.

According to the fourth embodiment, constraining conditions can be generated automatically so that reset operations can be controlled at appropriate timings. Power statuses during reset operations may vary due to process-dependent variations, temperature changes, and the like, which are hardly recognized in a design stage. According to this embodiment, appropriate constraining conditions can be generated even in such a case. Hence, more appropriate electric power supply and performance improvement can be expected. In this embodiment, for example, constraining conditions are generated so that power values supplied to the integrated circuit do not exceed a limit value. However, constraining conditions may be generated based on another power status such as a current value or a voltage drop, as described above.

Other Embodiments

Embodiments of the present invention can also be realized by a computer of a system or apparatus that reads out and executes computer executable instructions recorded on a storage medium (e.g., non-transitory computer-readable storage medium) to perform the functions of one or more of the above-described embodiment(s) of the present invention, and by a method performed by the computer of the system or apparatus by, for example, reading out and executing the computer executable instructions from the storage medium to perform the functions of one or more of the above-described embodiment(s). The computer may comprise one or more of a central processing unit (CPU), micro processing unit (MPU), or other circuitry, and may include a network of separate computers or separate computer processors. The computer executable instructions may be provided to the computer, for example, from a network or the storage medium. The storage medium may include, for example, one or more of a hard disk, a random-access memory (RAM), a read only memory (ROM), a storage of distributed computing systems, an optical disk (such as a compact disc (CD), digital versatile disc (DVD), or Blu-ray Disc (BD)™), a flash memory device, a memory card, and the like.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2013-051130, filed Mar. 14, 2013, which is hereby incorporated by reference herein in its entirety.

What is claimed is:

1. An integrated circuit comprising:
a plurality of circuit blocks;
an acquisition unit configured to acquire a request of a reset operation for at least one of the plurality of circuit blocks;
a determination unit configured to determine, based on constraining condition information indicating whether or not a reset target circuit block can perform the reset operation simultaneously with another circuit block in which the reset operation is underway, whether or not to instruct the reset target circuit block to perform the reset operation according to the request; and an instruction unit configured to instruct the reset target circuit block to start the reset operation according to the request when the determination unit determines to instruct the reset target circuit block to perform the reset operation.

2. The integrated circuit according to claim 1, wherein the determination unit is further configured to repetitively perform the determination until determining to instruct the reset target circuit block to perform the reset operation.

3. The integrated circuit according to claim 1, wherein the acquisition unit is further configured to store the request in a storage unit, and
the determination unit is further configured to sequentially perform the determination according to the request stored in the storage unit.

4. The integrated circuit according to claim 3, wherein the determination unit is further configured to sequentially perform the determination according to the request stored in the storage unit in an order of storage of the request in the storage unit.

5. The integrated circuit according to claim 4, wherein the acquisition unit is configured to be accessible to priority information indicating a priority of each of the circuit blocks for the reset operation, and is further configured to, upon acquiring the requests for at least two of the plurality of circuit blocks, store the requests in the storage unit in an order according to the priority information.

6. The integrated circuit according to claim 1, further comprising a voltage monitoring unit configured to monitor whether or not a voltage which allows the reset operation is supplied to the circuit block,
wherein the instruction unit is further configured to instruct the circuit block to start the reset operation according to the request when the determination unit determines to instruct the circuit block to perform the reset operation according to the request and the voltage which allows the reset operation is supplied to the circuit block.

7. The integrated circuit according to claim 6, wherein the plurality of circuit block include a circuit block to which a power supply voltage can be supplied in a controlled manner, and
the voltage monitoring unit is further configured to monitor, for the circuit block to which a power supply voltage can be supplied in a controlled manner, whether or not the voltage which allows the reset operation is supplied.

8. The integrated circuit according to claim 1, wherein the constraining condition information is generated so that reset operations are not simultaneously performed for a combination of circuit blocks, wherein a current value supplied to the integrated circuit exceed a limit value when the combination of circuit blocks simultaneously performs the reset operation.

9. The integrated circuit according to claim 1, wherein the constraining condition information is generated so that reset operations are not simultaneously performed for a combination of circuit blocks, wherein drops of voltages supplied to the circuit blocks exceed a limit value when the combination of circuit blocks simultaneously performs the reset operation.

10. The integrated circuit according to claim 1, wherein the constraining condition information is generated so that reset operations are not simultaneously performed for a combination of circuit blocks, wherein a power value supplied to the integrated circuit exceeds a limit value when the combination of circuit blocks simultaneously performs the reset operation.

11. The integrated circuit according to claim 1, further comprising a plurality of reset operation control units each connected to at least one circuit block and configured to control the reset operation of the connected circuit block,
wherein the instruction unit is further configured to instruct, via the reset operation control unit, the reset target circuit block connected to the reset operation control unit to start the reset operation according to the request.

12. The integrated circuit according to claim 11, wherein the determination unit is further configured to acquire, from the plurality of reset operation control units, information indicating whether or not each circuit block is performing the reset operation.

13. The integrated circuit according to claim 1, further comprising a circuit monitoring unit configured to monitor a status of the circuit block when the circuit block performs the reset operation; and
a generation unit configured to generate the constraining condition information using a monitoring result of the circuit monitoring unit.

14. The integrated circuit according to claim 13, wherein the monitoring result includes a power value to be consumed by the circuit block when the circuit block solely performs the reset operation, and
the generation unit is further configured to generate the constraining condition information so that reset operations are not simultaneously performed for a combination of circuit blocks, wherein a total of the power values to be consumed by the combination of circuit blocks exceeds a predetermined limit value.

15. The integrated circuit according to claim 1, further comprising a training unit configured to automatically generate the constraining condition information in an initial stage before a normal operation.

16. The integrated circuit according to claim 1, wherein each of the plurality of circuit blocks includes at least one controllably powered unit to which a power supply voltage is supplied in a controlled manner, the integrated circuit further comprises a power control unit configured to control the power supply voltage to the controllably powered unit, and the determination unit is further configured to determine whether or not to instruct the reset target circuit block to perform the reset operation according to the request based on power control information from the power control unit.

17. A control method of an integrated circuit comprising:
acquiring a request of a reset operation for at least one of a plurality of circuit blocks, wherein the integrated circuit comprises the plurality of circuit blocks;
determining, based on constraining condition information indicating whether or not a reset target circuit block can perform the reset operation simultaneously with another circuit block in which the reset operation is underway, whether or not to instruct the reset target circuit block to perform the reset operation according to the request; and
instructing the reset target circuit block to start the reset operation according to the request when it is determined to instruct the reset target circuit block to perform the reset operation.

* * * * *